(12) United States Patent
Reinke

(10) Patent No.: US 11,567,100 B2
(45) Date of Patent: Jan. 31, 2023

(54) VIBRATING BEAM ACCELEROMETER WITH ADDITIONAL SUPPORT FLEXURES TO AVOID NONLINEAR MECHANICAL COUPLING

(71) Applicant: Honeywell International Inc., Charlotte, NC (US)

(72) Inventor: John Reinke, Plymouth, MN (US)

(73) Assignee: Honeywell International Inc., Charlotte, NC (US)

(*) Notice: Subject to any disclaimer, the term of this patent is extended or adjusted under 35 U.S.C. 154(b) by 238 days.

(21) Appl. No.: 17/006,506

(22) Filed: Aug. 28, 2020

(65) Prior Publication Data

US 2021/0140993 A1    May 13, 2021

Related U.S. Application Data

(60) Provisional application No. 62/932,298, filed on Nov. 7, 2019, provisional application No. 62/932,397, filed on Nov. 7, 2019.

(51) Int. Cl.
*G01P 15/097* (2006.01)
*B81B 3/00* (2006.01)
(Continued)

(52) U.S. Cl.
CPC .......... *G01P 15/097* (2013.01); *B81B 3/0021* (2013.01); *B81B 7/007* (2013.01);
(Continued)

(58) Field of Classification Search
CPC ............... G01P 15/097; G01P 15/125; G01P 2015/0854; G01P 2015/0882;
(Continued)

(56) References Cited

U.S. PATENT DOCUMENTS

| 5,392,650 A | 2/1995 | O'Brien et al. |
| 5,396,798 A | 3/1995 | Frische |

(Continued)

FOREIGN PATENT DOCUMENTS

| CN | 103529242 A | 1/2014 |
| CN | 206132802 U | 4/2017 |
| WO | 1996/028735 | 9/1996 |

OTHER PUBLICATIONS

Boser, B.E., "Capacitive Interface Electronics for Sensing and Actuation," 21st Workshop on Advances in Analog Circuit Design, Mar. 2012, 33 pp.

(Continued)

*Primary Examiner* — Xin Y Zhong
(74) *Attorney, Agent, or Firm* — Shumaker & Sieffert, P.A.

(57) ABSTRACT

The disclosure describes techniques to adjust the geometry of a pendulous proof mass VBA to operate with sufficient signal-to-noise performance while avoiding nonlinear mechanical coupling at specified frequencies. The techniques of this disclosure include adding anchor support flexures to a resonator connection structure, adjusting shape, thickness, and the material of VBA components and of the VBA support structure to both control the frequency of any mechanical resonant modes and to adjust the mechanical mode frequencies away from desired operating frequencies and, in some examples, away from harmonics of desired operating frequencies.

20 Claims, 19 Drawing Sheets

(51) Int. Cl.
*H01L 41/08* (2006.01)
*B81B 7/00* (2006.01)
*G01P 15/125* (2006.01)
*H03H 9/24* (2006.01)
*G01P 15/08* (2006.01)

(52) U.S. Cl.
CPC .......... *G01P 15/125* (2013.01); *H01L 41/08* (2013.01); *B81B 2201/0235* (2013.01); *G01P 2015/0854* (2013.01); *G01P 2015/0882* (2013.01); *H03H 9/2473* (2013.01)

(58) Field of Classification Search
CPC ..... G01P 2015/0817; G01P 2015/0865; B81B 3/0021; B81B 7/007; B81B 2201/0235; H01L 41/08; H03H 9/2473; H03H 9/02275; H03H 9/02362; H03H 2009/02299
See application file for complete search history.

(56) References Cited

U.S. PATENT DOCUMENTS

| | | | |
|---|---|---|---|
| 5,969,249 | A | 10/1999 | Roessig et al. |
| 6,269,696 | B1 | 8/2001 | Weinberg et al. |
| 6,484,578 | B2 | 11/2002 | Woodruff et al. |
| 6,629,462 | B2 | 10/2003 | Otsuchi et al. |
| 6,662,657 | B2 | 12/2003 | Hulsing, II et al. |
| 7,024,934 | B2 | 4/2006 | Yu |
| 7,047,808 | B2 | 5/2006 | Malvern et al. |
| 7,104,129 | B2 | 9/2006 | Nasir et al. |
| 7,194,906 | B2 | 3/2007 | Mikado et al. |
| 7,980,115 | B2 | 7/2011 | Stewart et al. |
| 8,047,074 | B2 | 11/2011 | Nasiri et al. |
| 8,307,710 | B2 | 11/2012 | Dwyer et al. |
| 8,823,398 | B2 | 9/2014 | Balachandran et al. |
| 8,875,578 | B2 | 11/2014 | Smith |
| 9,201,090 | B2 | 12/2015 | Ungaretti et al. |
| 9,207,081 | B2 | 12/2015 | Geen |
| 9,310,391 | B2 | 4/2016 | Seshia et al. |
| 9,354,246 | B2 | 5/2016 | Simoni et al. |
| 9,689,888 | B2 | 6/2017 | Becka |
| 9,878,903 | B2 | 1/2018 | Lasalandra et al. |
| 9,983,225 | B2 | 5/2018 | Fertig et al. |
| 10,261,105 | B2 | 4/2019 | Clark |
| 2016/0139171 | A1* | 5/2016 | Becka ................. G01P 15/0922 216/41 |
| 2016/0349283 | A1* | 12/2016 | Bramhavar .......... H03H 3/0073 |
| 2017/0108529 | A1 | 4/2017 | Zhang et al. |
| 2020/0025792 | A1 | 1/2020 | Reinke |

OTHER PUBLICATIONS

Hopkins et al., "The Silicon Oscillating Accelerometer: A MEMS Inertial Instrument for Strategic Missile Guidance," Missile Sciences Conference, Nov. 2000, 8 pp.
Huang et al., "The Study of Equivalent Circuit for Vibrating-beam-type Resonant Accelerometer," Applied Mechanics and Materials, vols. 263-266, Dec. 2012, 5 pp.
Kaya et al., "Design of a MEMS Capacitive Comb-drive Accelerometer," 2011 COMSOL Conference, Oct. 2011, 6 pp.
Kwok et al., "Fluid Effects in Vibrating Micromachines Structures," Journal of Microelectromechanical Systems, vol. 14, No. 4, Aug. 2005, 14 pp.
Pham, L. et al. "Vibration Rectification in MEMS Accelerometers," Technical Article from Analog Devices, 2018, 4 pp. (Applicant points out, in accordance with MPEP 609.04(1), that the year of publication, 2018, is sufficiently earlier than he effective U.S. filing date, so that the particular month of publication is not in issue.).
Zhang et al., "Microelectromechanical Resonant Accelerometer Designed with a High Sensitivity," Sensors, vol. 15, No. 12, Dec. 2015, 18 pp.
Zhou et al., "Air Damping Analysis in Comb Microaccelerometer," Advances in Mechanical Engineering, vol. 6, Apr. 2014, 7 pp.
"Honeywell Aerospace Accelerometer Glossary of Terms," accessed from https://aerocontent.honeywell.com/aero/common/documents/myaerospacecatalog-documents/Missiles-Munitions/Accelerometer_Glossary_of_Terms, on Feb. 25, 2019, 2 pp.
"Quality Factor/Q Factor; formulas and equations," from Electronics Notes, accessed from https://electronic-notes.com/articles/basic_concepts/q-quality-factor/basics-tutorial-formula.php, on Feb. 25, 2019, 3 pp.
"Readout Circuit—an overview," from ScienceDirect Topics accessed from https://www.sciencedirect.com/topics/engineering/readout-circuit on Apr. 16, 2020, 30 pp.
"Underdamped System—an overview" from ScienceDirect Topics, accessed from https://www.sciencedirect.com/topics/engineering/underdamped-system, Feb. 25, 2019, 14 pp.
U.S. Appl. No. 16/796,138, filed Feb. 20, 2020 by Reinke.

* cited by examiner

VIBRATING BEAM ACCELEROMETER WITH ADDITIONAL SUPPORT FLEXURES TO AVOID NONLINEAR MECHANICAL COUPLING

This application claims the benefit of:
U.S. Provisional Patent Application 62/932,397, filed 7 Nov. 2019, and
U.S. Provisional Patent Application 62/932,298, filed 7 Nov. 2019, the entire contents of each being hereby incorporated by reference.

STATEMENT REGARDING FEDERALLY SPONSORED RESEARCH OR DEVELOPMENT

This invention was made with Government support under HR0011-16-9-0001 awarded by DARPA. The Government has certain rights in the invention.

TECHNICAL FIELD

The disclosure relates to vibrating beam accelerometers.

BACKGROUND

Accelerometers function by detecting a displacement of a proof mass under inertial forces. In one example, an accelerometer may detect the displacement of a proof mass by the change in frequency of a resonator connected between the proof mass and a support base. A resonator may be designed to change frequency proportional to the load applied to the resonator by the proof mass under acceleration. The resonator may be electrically coupled to signal generation circuitry forming an oscillator, which causes the resonator to vibrate, and in some examples at the resonant frequency of the resonator.

SUMMARY

In general, the disclosure provides techniques to improve the function of vibrating beam accelerometers (VBA). In one example, the disclosure describes techniques to damp the proof mass motion of an accelerometer while achieving an underdamped resonator. In an example of an in-plane micro-electromechanical systems (MEMS) VBA, the proof mass may contain one or more damping combs that include one or more banks of movable comb fingers attached to the proof mass. The movable comb fingers may be interdigitated with anchored comb fingers that are attached to fixed geometry. These damping comb fingers may provide air damping for the proof mass when the MEMS die is placed into a pressure cavity of a package containing a pressure above a vacuum. In some examples, the MEMS die may be placed into a ceramic package that contains a pressure of approximately 1 Torr. The geometry of the damping combs may minimize the air gap and maximize the overlapping area between the movable comb fingers and anchored comb fingers. The geometry of resonator of the VBA of this disclosure may be configured to avoid air damping.

In other examples this disclosure describes techniques of configuring capacitive comb fingers of an accelerometer resonator into discreet electrodes with a drive electrode and at least two sense electrodes. The techniques of this disclosure further describe the routing of electrical signals on the die and on the analog electronics board designed to produce parasitic feedthrough capacitances that are approximately equal. The at least two sense electrodes may be placed on opposite sides of the moving resonator beams such that the changes in capacitance with respect to displacement (e.g. dC/dx) are approximately equal in magnitude and opposite in sign. This may result in sense currents that are also opposite in sign and result in feedthrough currents will be of the same sign. The sense outputs from the resonators may be connected to a differential front-end amplifier, such as a transimpedance or charge amplifier, which processes the difference in output currents. Processing the difference in output currents may mitigate the effect of the feedthrough currents and cancel parasitic feedthrough capacitance. Parasitic feedthrough capacitance may cause increased accelerometer noise and reduced bias stability.

In other examples the disclosure describes techniques to adjust the geometry of a pendulous proof mass VBA to operate with sufficient signal-to-noise performance while avoiding nonlinear mechanical coupling at specified frequencies. The techniques of this disclosure include adding anchor support flexures to a resonator connection structure, adjusting shape, thickness, and the material of VBA components and of the VBA support structure to both control the frequency of any mechanical resonant modes and to adjust the mechanical mode frequencies away from desired operating frequencies and, in some examples, away from harmonics of desired operating frequencies.

In other examples, the disclosure describes pendulous mass vibrating beam accelerometer (VBA) device, the device comprising: a pendulous proof mass; a support base defining a first plane; a resonator connection structure mechanically connected to the support base with an anchor, wherein the resonator connection structure is in a second plane parallel to the first plane; a first anchor support flexure mechanically connected to the support base and mechanically connected to a first end of the resonator connection structure; a second anchor support flexure mechanically connected to the support base and mechanically connected to a second end of the resonator connection structure. The second end of the resonator connection structure is opposite the first end. The VBA further comprises a hinge flexure configured to connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base; and one or more resonators configured to connect the pendulous proof mass to the resonator connection structure and to flex in the second plane based on a rotation of the pendulous proof mass about the hinge flexure, wherein each of the one or more resonators vibrate at a respective driven resonant frequency. The pendulous proof mass, the hinge flexure, and the one or more resonators are in the second plane, and the first anchor support flexure and the second anchor support flexure are configured to support the resonator connection structure such that a frequency window at approximately twice the respective driven resonant frequency of the one or more resonators avoids a mechanical mode frequency of the device.

In other examples the disclosure describes a method comprising: receiving, by processing circuitry, one or more electrical signals indicative of a frequency of a first resonator beam and a frequency of a second resonator beam from a vibrating beam accelerometer (VBA). The VBA comprises: a pendulous proof mass; a support base defining a first plane; a resonator connection structure mechanically connected to the support base with an anchor, wherein the resonator connection structure is in a second plane parallel to the first plane; a first anchor support flexure mechanically connected to the support base and mechanically connected to a first end of the resonator connection structure; a second anchor support flexure mechanically connected to the support base and mechanically connected to a second end of the resonator connection structure, wherein the second end of the resonator connection structure is opposite the first end; a hinge flexure configured to connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the VBA parallel to the first plane of the support base; and one or more resonators configured to connect the pendulous proof mass to the resonator connection structure and to flex in the second plane based on a rotation of the pendulous proof mass about the hinge flexure. Each of the one or more resonators vibrate at a respective driven resonant frequency, and the one or more resonators comprise the first resonator beam and the second resonator beam. The pendulous proof mass, the hinge flexure, and the one or more resonators are in the second plane, and the first anchor support flexure and the second anchor support flexure are configured to support the resonator connection structure such that a frequency window at approximately twice the respective driven resonant frequency of the one or more resonators avoids a mechanical mode frequency of the device. The method further comprises determining, by the processing circuitry and based on the one or more electrical signals, the frequency of the first resonator beam and the frequency of the second resonator beam; and calculating, by the processing circuitry and based on the frequency of the first resonator beam and the frequency of the second resonator beam, an acceleration of the VBA.

In other examples the disclosure describes a system for determining acceleration, the system comprising: a pendulous mass vibrating beam accelerometer (VBA), comprising: a pendulous proof mass; a support base defining a first plane; a resonator connection structure mechanically connected to the support base with an anchor, wherein the resonator connection structure is in a second plane parallel to the first plane; a first anchor support flexure mechanically connected to the support base and mechanically connected to a first end of the resonator connection structure; a second anchor support flexure mechanically connected to the support base and mechanically connected to a second end of the resonator connection structure, wherein the second end of the resonator connection structure is opposite the first end; a hinge flexure configured to connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base; and one or more resonators configured to connect the pendulous proof mass to the resonator connection structure and to flex in the second plane based on a rotation of the pendulous proof mass about the hinge flexure, wherein each of the one or more resonators vibrate at a respective driven resonant frequency. The pendulous proof mass, the hinge flexure, and the one or more resonators are in the second plane, and the first anchor support flexure and the second anchor support flexure are configured to support the resonator connection structure such that a frequency window at approximately twice the respective driven resonant frequency of the one or more resonators avoids a mechanical mode frequency of the device. The system also includes processing circuitry operatively connected to the pendulous mass VBA via a resonator driver circuit, wherein: the resonator driver circuit is configured to output a first signal that causes the one or more resonators of the pendulous mass VBA to vibrate at a respective resonant frequency of each of the one or more resonators, an acceleration of the pendulous mass VBA in a direction substantially parallel to the second plane causes a rotation of the pendulous proof mass about the hinge flexure parallel to the second plane, the one or more resonators are configured to receive a force, in response to the rotation of the pendulous proof mass, such that the force causes a respective change in resonant frequency of the one or more resonators, and the processing circuitry is configured to receive a second signal from the pendulous mass VBA indicative of a respective change in the resonant frequency and based on the respective change in resonant frequency, determine an acceleration measurement.

DETAILED DESCRIPTION

The techniques of this disclosure may be incorporated into a variety of VBAs. For example, the techniques of planar geometry and a single primary mechanical anchor between the support base and the VBA described by U.S. patent application Ser. No. 16/041,244, which is hereby incorporated by reference in its entirety, may be combined with the techniques of this disclosure.

Figure 1:
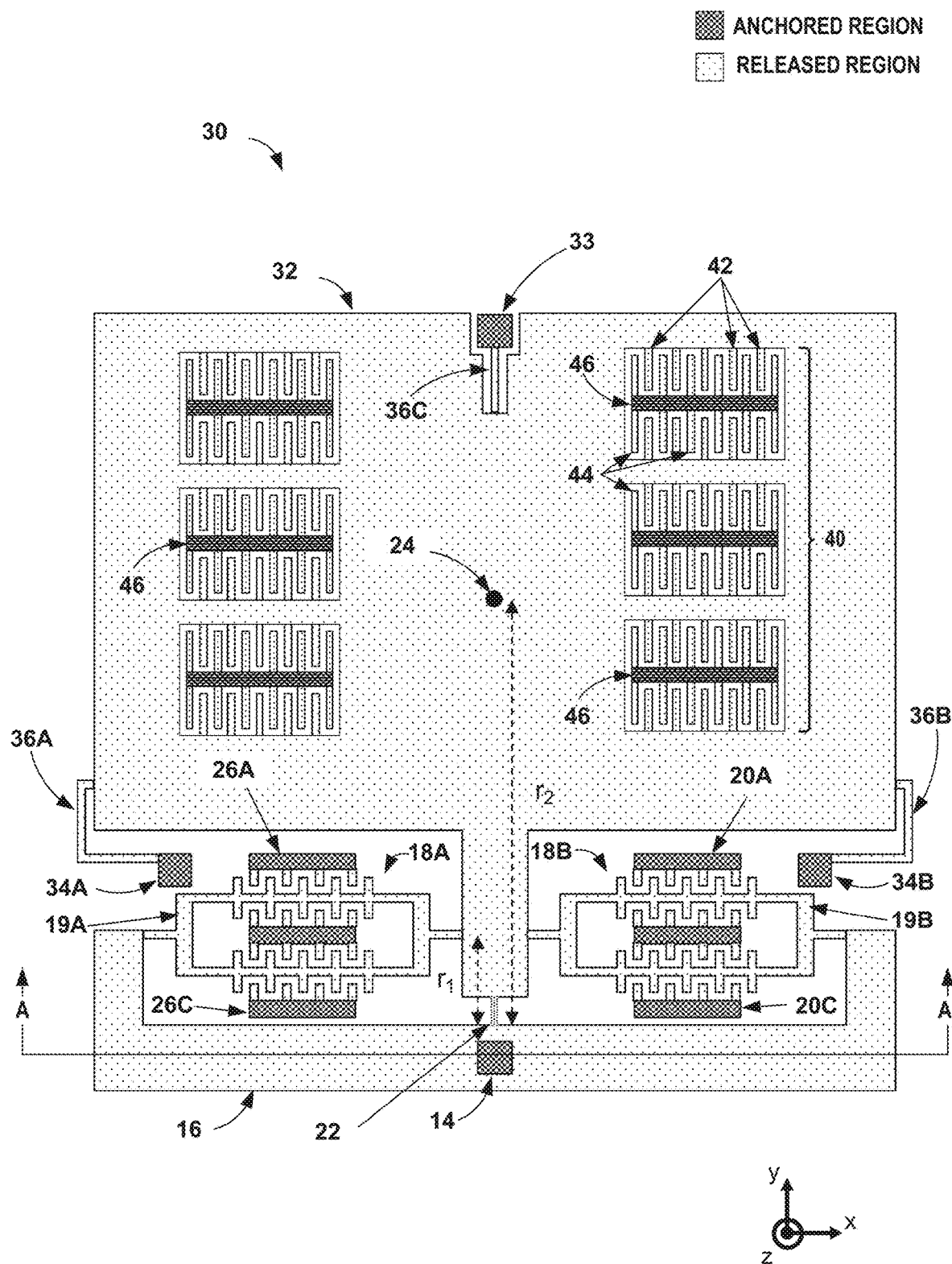
FIG. 1 is a conceptual diagram illustrating a pendulous VBA with supporting flexures, X-direction resonators, and damping combs.

FIG. 1 is a conceptual diagram illustrating a pendulous VBA with supporting flexures and with X-direction resonators. FIG. 1 is a top view of VBA 30 showing the anchor 14 to the support base, but the support base is not shown in FIG. 1. VBA 30 includes pendulous proof mass 32 connected to anchor 14 and resonator connection structure 16 at hinge flexure 22, with damping combs 40 and resonators 18A and 18B. FIG. 1 also shows section A-A', which runs along the long axis of resonator connection structure 16 and through anchor 14.

Pendulous proof mass 32 includes supporting flexures and connects to resonator connection structure 16 at anchor 14 by hinge flexure 22. Hinge flexure 22 suspends the proof mass at anchor 14 and the point at which hinge flexure 22 connects to anchor 14 is the center of rotation for proof mass 32. Left and right resonators 18A and 18B connect to the same primary anchor 14 by resonator connection structure 16. Resonators 18A and 18B connect to proof mass 32 at a distance r1 from the center of rotation for proof mass 12. Center of mass 24 for proof mass 12 is at a distance r2 from the center of rotation for proof mass 12. The arrangement of VBA 30 results in the inertial force of proof mass 12 on the released beams of resonator beams 19A and 19B amplified by the leverage ratio r2/r1.

In the example FIG. 1, VBA 30 may be implemented as an in-plane micro-electromechanical systems (MEMS) VBA. Proof mass 32 may contain one or more damping combs 40 that include one or more banks of movable comb fingers 42 attached to proof mass 32. Movable comb fingers 42 may be interdigitated with anchored comb fingers 44 that are attached to fixed geometry, such as anchors 46. These damping comb fingers 42 and 44 lie in the same plane as proof mass 32 and may provide air damping for proof mass 32 when the MEMS die is placed into a package containing a pressure above a vacuum. In some examples, the MEMS die may be placed into a ceramic package that contains an inside pressure of approximately 1 Torr. Changes in pressure may change the degree of damping. In this disclosure, "movable comb fingers 42" may be referred to as "rotor comb fingers 42." Also, "anchored comb fingers 44" may be referred to as "stator comb fingers 44."

In this disclosure air damping may include damping cause by two surfaces sliding past each other, e.g. Couette damping. In other examples, air damping may include two surfaces approaching each other, e.g. squeezed-film damping. In some examples, one type of air damping may have a greater effect that other types of air damping and may be dependent on the VBA geometry.

The geometry of the damping combs 40 may minimize the air gap and maximize the overlap area between the movable comb fingers 42 and anchored comb fingers 44. As depicted by FIG. 1, a first comb finger of the movable comb fingers is adjacent to a first comb finger and a second comb finger of the anchored comb fingers. The overlapped portion has a total linear distance. The total linear distance is a sum of first length and second length. The first length is a linear distance in which a first edge of a first comb finger of the movable comb fingers overlaps with a first edge of a first comb finger of the anchored comb fingers. The second length is a linear distance in which a second edge of the first comb finger of movable comb fingers overlaps with a first edge of a second comb finger of the anchored comb fingers. The example of FIG. 1 shows six damping combs. However, in other examples, a VBA may include more or fewer damping combs. More damping combs may result in a larger overlapped portion and therefore a longer total linear distance. A longer total linear distance may result in greater damping. Similarly, more fingers per damping comb may result in a longer total linear distance and greater damping. Movable comb fingers and anchored comb fingers may be configured with a variety of widths, in the X-direction. Thinner (e.g. skinnier) fingers may result in more fingers, more total linear distance and greater damping. Also, movable comb fingers and anchored comb fingers may be configured with a variety of lengths, in the Y-direction. Longer fingers may result in more total linear distance and greater damping. Because the quality factor depends on the damping as well as the mass and stiffness of VBA 30, in selecting the geometry of the damping combs 40 a designer may consider the desired amount damping and the mechanical and structural strength of VBA 30

Proof mass 32 may include one or more support flexures to increase stiffness of proof mass 32 in the out-of-plane (z) direction. In other words, the support flexures, e.g. flexure 33, coupled to proof mass 32 are configured to restrict out-of-plane motion of the pendulous proof mass with respect to the X-Y plane parallel to the proof mass 32 and resonator connection structure 16. These flexures are configured to be substantially more flexible in the in-plane (x and y) directions than the rigid resonator connection structure or the axial stiffness of the resonators. For example, flexure 33 includes an anchor portion, connected to the support base (not shown in FIG. 1) similar to the primary anchor 14 and anchors 46. Flexure 33 may include a flexible portion 36C connected between the anchor portion 33 and proof mass 32. The flexible portion 36C may be of the same or similar material to that of proof mass 32. The configuration of the one or more support flexures may reduce out of plane movement, while avoiding bias caused by forces applied to the accelerometer mechanism (e.g. proof mass 32 and resonators 18A and 18B) that may be caused by CTE mismatch between the substrate and the accelerometer mechanism.

Proof mass 32 may include additional support flexures, such as the flexures with anchor portions 34A and 34B and flexible portions 36A and 36B. As described above for flexure 33, flexible portions 36A and 36B may be of the same or similar material to proof mass 32. The position of anchor portions 34A and 34B and the shape and configuration of flexible portions 36A and 36B shown in FIG. 1 is just one example technique for providing support flexures to stiffen movement of proof mass 32 in the out-of-plane (z) direction. In other examples, flexible portions 36A and 36B may have different shapes, such as a straight beam or an S-shape. In other examples, VBA 30 may have more or fewer support flexures. The anchor portions of support flexures of this disclosure will not exert significant forces on proof mass 32, so the mechanism of VBA 30 will still be connected to the structure of the support base primarily by a single anchor region, e.g. anchor 14. Advantages of the geometry of VBA 30 may include reduced bias errors that may otherwise result from the thermal expansion mismatch between the glass substrate (support base) and the silicon mechanism (e.g. pendulous proof mass 32).

Use of a single primary mechanical anchor 14 may reduce or prevent bias errors that can be caused by external mechanical forces applied to the circuit board, package, and/or substrate that contains the accelerometer mechanism. Since the source of these forces may be unavoidable (e.g., thermal expansion mismatch between the substrate and mechanism), the geometry of the VBA of this disclosure may mechanically isolate the sensitive components. Another advantage may include reduced cost and complexity, by achieving the mechanical isolation within the MEMS mechanism, which may avoid the need for additional manufacturing steps or components, such as discrete isolation stages.

Damping combs 40 is one example technique to damp the proof mass motion of an accelerometer while achieving an underdamped resonator. Vibrating beam accelerometers (VBAs) function by using a proof mass to apply inertial force to a vibrating beam, aka resonators 18A and 18B, such that the applied acceleration can be measured as a change in resonant frequency of the vibrating beam.

A high quality factor may provide a benefit of mitigating the phase shift inherent to the resonator control electronics. This phase shift may cause a frequency shift, which ultimately manifests as a bias error. A large quality factor (Q), i.e., substantially underdamped, also may decrease the applied voltage necessary to achieve a certain displacement amplitude. However, to minimize vibration rectification error (VRE), the motion of the proof mass may be substantially damped, and in some examples may be critically damped, i.e. returns an equilibrium state as quickly as possible without oscillating. Without sufficient proof mass damping, the accelerometer output may exhibit unacceptable bias errors in the presence of environmental vibration.

In contrast to damping combs 40, the geometry of resonators 18a and 18B of VBA 30 of this disclosure may be designed to avoid air damping. The geometry and the partial pressure of the components of a MEMS VBA of this disclosure may enable underdamped resonators with relatively high quality-factor, Q but damp the proof mass such that the proof mass Q is relatively low when compared to the Q of the resonators. For example, a reduced total linear distance for the combs on resonators 18, when compared with the total linear distance for damping combs 40 may configure the relative Q between combs for resonators 18 and damping combs 40. Similarly, the air gap between the anchored and released portions of resonators 18, and the air gap between rotor comb fingers 42 and stator comb fingers 44 of damping combs 40 also may impact the relative Q.

A quality factor Q is often assigned to a damped oscillator, where Q is the ratio of stored energy in the oscillator to the energy dissipated per radian. In an overdamped system, the system returns to equilibrium without oscillating. A critically damped system returns to equilibrium as quickly as possible without oscillating. An underdamped system may oscillate (at reduced frequency compared to the undamped case) with the amplitude gradually decreasing to zero. The quality factor may be written as:

$$Q=E/[-dE/c\theta]$$

When $dE/d\theta$ is written as $(dE/dt)/(d\theta/dt)$ the equation becomes: $Q=E/[-dE/dt/d\theta/dt]$. Since $dE/dt$ is P, the power dissipated, and $d\theta/dt$ is the angular frequency $\omega$, this may be written as:

$$Q=\omega E/[-dE/dt]=\omega E/P=\omega(\text{stored energy/power dissipated}).$$

The frequency may be further described as: $\omega_1$ is the underdamped oscillation frequency (slightly smaller than the undamped frequency $\omega_o$): $\omega_1^2=\omega_o^2-\beta^2$.

The techniques of this disclosure may be applied, for example, to micro-electromechanical systems (MEMS) vibrating beam accelerometers (VBAs), which represents one of multiple possibilities capable of achieving the required accelerometer performance. The techniques of this disclosure may improve the basic operation of a VBA. In existing MEMS VBAs, the resonator may be substantially underdamped (with Q's ranging from 100's to potentially 100,000's), which may reduce the effects of the phase shift from the control electronics on the closed-loop resonant frequency. An underdamped resonator contrasts with a second design goal of damping the proof mass, as discussed above. These techniques may provide a means to achieve an underdamped resonator (Q~1000's) while also damping the proof mass which represents an advantage over other alternative solutions.

Alternative solutions exist for proof mass partial damping, but some alternatives have disadvantages that limit the required combination of performance, cost, and size, weight and power (SWaP). A first alternative example may include sealing both the proof mass and resonator at full atmosphere. The full atmosphere solution may work for larger piezoelectric devices. But air damping of the resonator becomes excessive after scaling dimensions down to typical MEMS scale. Excessive air damping may limit the capabilities of the electrostatic drive and increase the device's susceptibility to phase errors from the control electronics.

A second alternative example may include sealing the proof mass and resonator in separate cavities such that proof mass is packaged at full atmosphere while the resonator is packaged at vacuum. This alternative may significantly complicate device fabrication, and therefore may ultimately increase cost.

A third alternative example may include sealing the proof mass and resonator at vacuum. The third alternative may mitigate vibration rectification error by setting the proof mass resonant frequency to be substantially higher than environmental vibration frequencies. Unfortunately, the available die size and minimum resonator beam width dimensions may prevent this solution from being feasible. Under the current constraints, substantially increasing the proof mass frequency may result in a low scale factor, which could ultimately cause poor bias performance.

A fourth example may include sealing the proof mass and resonator at vacuum. Force rebalance actuators that actively suppress vibration may mitigate vibration rectification error by force rebalance actuators that actively suppress vibration. Additional actuation electrodes could be included to counteract vibration at high frequencies (>100 Hz) while allowing the proof mass to deflect at lower frequencies (<100 Hz). This solution may be feasible but introduces additional complexity, and presumably cost, to both the mechanical device and supporting electronics.

The techniques of this disclosure, compared to prior art techniques, may provide a means to damp the proof mass while leaving the resonators significantly underdamped. This damping is achieved through gas damping without requiring separate cavities for different pressures. Ultimately, the techniques of this disclosure may enable navigation-grade accelerometers with reduced cost and SWaP to maintain bias repeatability in the presence of environmental vibration. These techniques may avoid separate pressure cavities and/or more complicated supporting electronics, both of which can lead to higher cost.

Use of partial pressure damping may include integrating the following features into a VBA design:

1. The proof mass may have large portions of area that define a small air gap (typically on the order of microns) between the proof mass and anchored geometry. Given sufficient gas pressure, this gap may generate air damping and ultimately reduce the Q of the proof mass motion.
2. The resonator may have only small portions of area that contribute to air damping, which may enable relatively high-Q resonator motion.
3. The MEMS device may be packaged at a partial pressure that, in conjunction with the proof mass damping, results in a relatively high-Q resonator motion (Q 100's or higher) and a low-Q proof mass motion (Q<100).

In some examples, the partial pressure techniques may be implemented within an in-plane MEMS VBA. As shown in FIG. 1, proof mass 32 that includes banks of rotor comb fingers 42 interdigitated with stator comb fingers 44 may be attached to fixed geometry portions 46 of the accelerometer. These damping comb 40 fingers provide air damping for proof mass 32. To maximize damping, the air gap may be reduced while the overlap area between the comb fingers 42 and 44 is maximized. Unlike the damping combs, the resonator may be configured to avoid air damping. The MEMS die is placed into a ceramic package that contains a pressure of approximately 1 Torr. This partial pressure may enable resonators with relatively high Q (~1000) but keeps the proof mass Q somewhat damped (Q~10's).

In addition to an in-plane MEMS VBA, the same concept can be applied to an out-of-plane MEMS VBA. Such a device may use a parallel plate gap between the proof mass and anchored geometry instead of interdigitated comb fingers. The underlying concept may be the same, that is, air damping would damp the proof mass while leaving the resonators with relatively high Q. A similar partial pressure on the order of 1 Torr would likely result in sufficient damping.

Note that the techniques of this disclosure can apply to VBAs operating by different methods of actuation. For example, piezo-electric actuation of the resonators could alleviate the need for small capacitive air gaps within the resonator geometry. Larger air gaps could enable an even larger differences between the resonator Q and the proof mass Q. In some examples, VBAs may provide proof mass damping via banks of damping combs embedded within the proof mass, but other geometries and configurations could theoretically achieve a similar effect. In some examples, damping combs may be attached to the sides of the proof mass rather than being embedded in the middle. For some designs, merely the edge of the proof mass itself with a sufficiently small air gap might be enough to provide proof mass damping.

Figure 2:
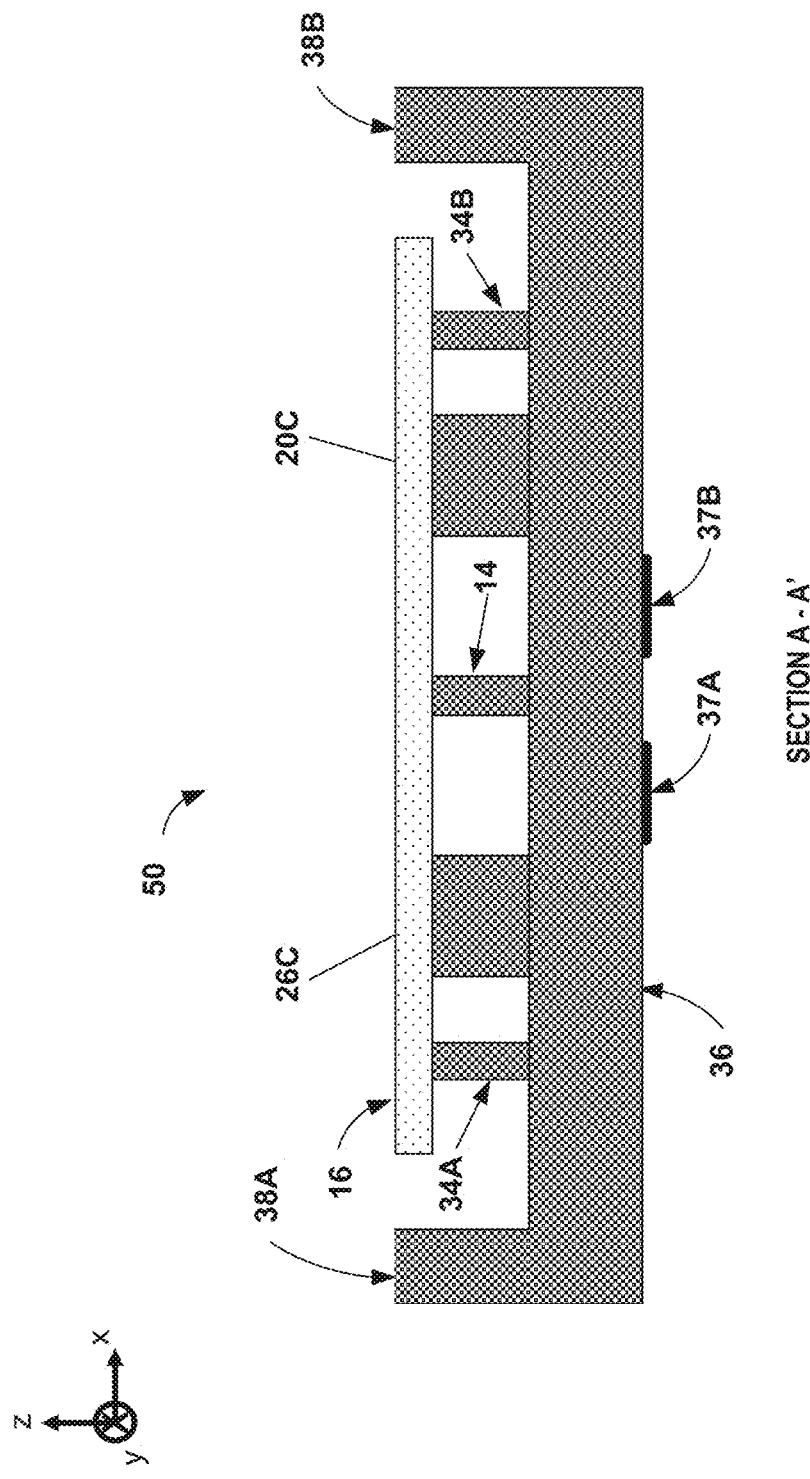
FIG. 2 is a conceptual diagram illustrating a sectional view of a pendulous VBA with supporting flexures and with X-direction resonators.

FIG. 2 is a conceptual diagram illustrating a sectional view of a pendulous VBA with supporting flexures and with X-direction resonators. FIG. 2 shows section A-A' of VBA 30 depicted in FIG. 1, which runs down the long axis of resonator connection structure 16 and through anchor 14. Items in FIG. 2 with the same reference numbers as in FIG. 1 have the same description, properties and function as described above. For example, VBA 50 includes pendulous proof mass 32 (not shown in FIG. 2) connected to resonator connection structure 16 at anchor 14. FIG. 2 also shows the anchor portion of anchored combs 26C and 20C, as well as the anchored portions of the support flexures, 34A and 34B. Anchors 46 for damping combs 40 may also be mechanically connected to support base 36 (not shown in FIG. 2).

As with VBA 30 described above in relation to FIG. 1, VBA 50 may be fabricated using silicon and glass masks such that both the proof mass 32 and resonator connection structure 16 are primarily anchored to a single region, e.g. at anchor 14. The released silicon mechanical structure of VBA 50 may be tethered to support base 36, which may be a glass substrate, such as quartz substrate or a silicon substrate. Proof mass 32 may be also tethered at other anchor regions, e.g. anchor portions 34A and 34B, configured to allow the released silicon portions, such as proof mass 32 and the resonator beams 19A and 19B of resonators 18A and 18B (not shown in FIG. 2) to move freely relative to the support base 36.

Support base 36 may include enclosing structures, such as structures 38A and 38B, which may surround the released portions of VBA 30. In some examples, VBA 30 may include both lower support base 36 and an upper support (not shown in FIG. 2). In some examples the anchored portions, e.g. anchor 14, may be mechanically connected to both the lower support base 36 and the upper support. Support base 36 may define a second plane, also substantially parallel to the X-Y plane that is different from the plane of the released portions of VBA 30. The plane defined by the released portions of VBA 30 (e.g. resonator beams 19A-19B and proof mass 32) may be substantially parallel to the second plane defined by support base 36. As described above in relation to FIG. 1, air gaps between the plane of the proof mass and the plane of support base 36 may allow the silicon portions, such as the proof mass, to move freely relative to the substrate.

Resonator connection structure 16 may be configured to be more rigid than the resonators. The rigid structure of resonator connection structure 16 connects to the resonators and branches back to the primary mechanical anchor 14, which is connected to support base 36. Resonator connection structure 16, as described above, may be sized to be stiffer than the axial spring constant of the resonators and supports the resonators in the in-plane (e.g. x and y) directions. In some examples, resonator connection structure 16 may be an order of magnitude stiffer than resonator beams 19A-19B. The single primary anchor 14 allows the mechanical connections of the released portions of VBA 30 to thermally expand at a different rate or direction of the support base 36 without being restrained by other connections to support base 36 that may cause bias and inaccuracy.

Support base 36 may include metal layers deposited onto the glass substrates (not shown in FIG. 2), which define electrical wires that connect silicon electrodes to wire bond pads. In some examples, support base 36 may include bond pads and other metal structures on the bottom surface of support base 36 (e.g. as indicated by the arrow from 36), such as conductive paths 37A and 37B. In some examples, support base 36 may include metal layers on the top surface, e.g. on the surface opposite the bottom surface, and in other examples, support base 36 may include intermediate metal layers between the top and bottom surfaces (not shown in FIG. 2). In some examples the metal layers may electrically connect to each other with vias, or other types of connections through support base 36. In some examples, electrical wires may also be defined with other conductive material other than metal. As described above in relation to FIG. 1, the metal layers, or other conductive material, may define electrical paths to carry signals to and from VBA 30, such as conductive paths 37A and 37B.

As described above in relation to FIG. 1, each resonator of the one or more resonators may include a resonator beam with released comb (e.g. 19A) and an anchored comb (e.g. 20C and 26C). As shown in FIG. 2, the anchor portion of anchored combs 20C and 26C extend from the plane of support base 36 to the plane of the released portions of VBA 30. The comb portions of anchored combs 20C and 26C are supported in the same plane as resonator beams 19A-19B and proof mass 12 and 32, described above in relation to FIG. 1.

Figure 3A:
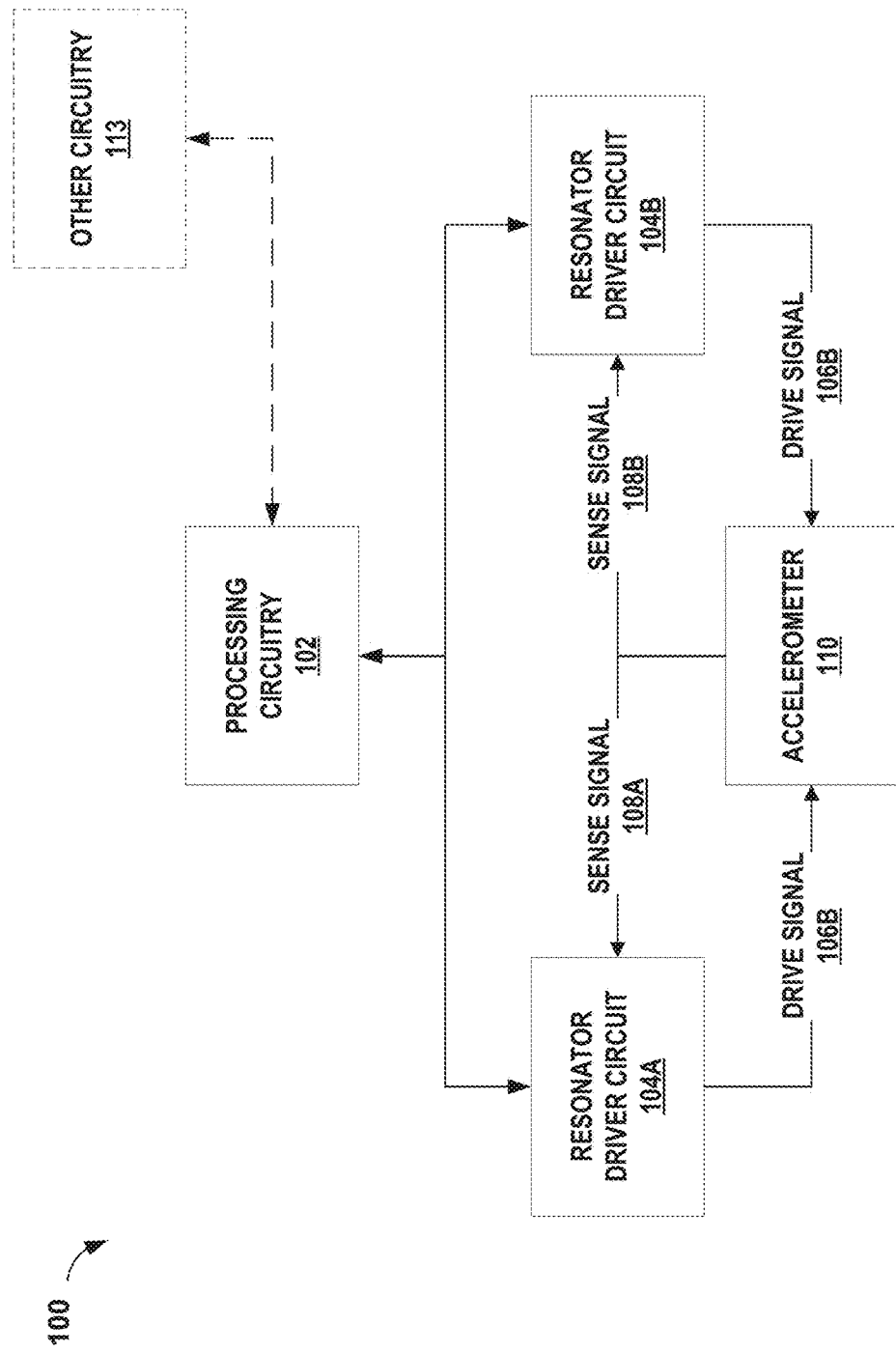
FIG. 3A is a block diagram illustrating a system including a pendulous VBA according to one or more techniques of this disclosure.

FIG. 3A is a functional block diagram illustrating a system including a pendulous VBA according to one or more techniques of this disclosure. The functional blocks of system 100 are just one example of a system that may include a VBA according to this disclosure. In other examples, functional blocks may be combined, or functions may be grouped in a different manner than depicted in FIG. 3A. Other circuitry 113 may include power supply circuits and other processing circuits that may use the output of accelerometer 110 to perform various functions, e.g. inertial navigation and motion sensing.

System 100 may include processing circuitry 102, resonator driver circuits 104A and 104B, and accelerometer 110. Accelerometer 110 may include any VBA, including the pendulous proof mass VBA accelerometers described above in relation to FIGS. 1-4B.

In the example of FIG. 3A, resonator driver circuits 104A and 104B are operatively connected to accelerometer 110 and may send drive signals 106A and 106B to accelerometer 110 as well as receive sense signals 108A and 108B from accelerometer 110. In the example of FIG. 3A, resonator driver circuit 104A may be coupled to one resonator, e.g. resonator 18A depicted in FIG. 1, and resonator driver circuit 104B may be coupled to a second resonator, e.g. resonator 18B. Resonator driver circuits 104A and 104B may be configured to output a signal that causes the resonators of accelerometer 110 to vibrate at a respective driven resonant frequency of each of the resonators. In some examples, vibrate means to excite and sustain mechanical motion for each resonator through electrostatic actuation. In some examples, resonator driver circuits 104A and 104B may include one or more oscillator circuits. In some examples the signal to accelerometer 110 may travel along conductive pathways along or within the support base of accelerometer, such as support base 36 described above in relation to FIG. 2. The signal from resonator driver circuits 104A and 104B may provide a patterned electric field to cause resonators of accelerometer 110 to maintain resonance. Processing circuitry 102 in combination with resonator driver circuits 104A and 104B may be an example of the control electronics described above in relation to FIG. 1.

Resonator driver circuit 104A may output drive signal 106A at a different frequency than drive signal 106B from resonator driver circuit 104B. The example of FIG. 3A may be configured to determine a differential frequency signal based on sense signals 108A and 108B. Resonator driver circuits 104A and 104B may adjust the output of drive signals 106A and 106B based on the feedback loop from sense signals 108A and 108B, e.g. to maintain the resonators at the respective resonant frequency. As described above, a VBA according to this disclosure may include one resonator or more than two resonators and may also include fewer or additional resonator driver circuits.

In this disclosure, a "differential frequency" measurement may include combinations of frequencies beyond a simple subtraction. In some examples an output of a first resonator may be weighted differently than the output of a second or third resonator as part of the differential frequency measurement. For example, a first resonator may be weighted to 98% of the resonator output as part of determining the differential frequency measurement compared to other resonators. In other examples, the output of each resonator may be squared, or otherwise processed, as part of determining the differential frequency measurement. In other examples any combination of weighting, square, square root, inversion or other processing may be part of determining the differential frequency measurement.

As described above in relation to FIGS. 1 and 2, an acceleration of the pendulous mass VBA, e.g. in a direction substantially parallel to the plane of the proof mass, may cause a rotation of the pendulous proof mass about the hinge flexure parallel to the plane of the proof mass. The resonators of accelerometer 110 may be configured to receive a force, in response to the rotation of the proof mass, such that the force causes the resonator to flex in the plane of the proof mass and cause a respective change in resonant frequency of at least one resonator.

Processing circuitry 102 may communicate with resonator driver circuits 104A and 104B. Processing circuitry 102 may include various signal processing functions, such as filtering, amplification and analog-to-digital conversion (ADC). Filtering functions may include high-pass, band-pass, or other types of signal filtering. In some examples, resonator driver circuits 104A and 104B may also include signal processing functions, such as amplification and filtering. Processing circuitry 102 may output the processed signal received from accelerometer 110 to other circuitry 113 as an analog or digital signal. Processing circuitry 102 may also receive signals from other circuitry 113, such as command signals, calibration signals and similar signals.

Processing circuitry 102 may operatively connect to accelerometer 110, e.g. via resonator driver circuits 104A and 104B. Processing circuitry 102 may be configured to receive the signal from accelerometer 110, which may indicate of a respective change in the resonant frequency of at least one resonator of accelerometer 110. Based on the respective change in resonant frequency, processing circuitry 102 may determine an acceleration measurement. In other examples (not shown in FIG. 3A), processing circuitry 102 may be part of the feedback loop from accelerometer 110 and may control the drive signals 106A and 106B to sustain motion of the resonators at their resonant frequency.

Figure 3B:
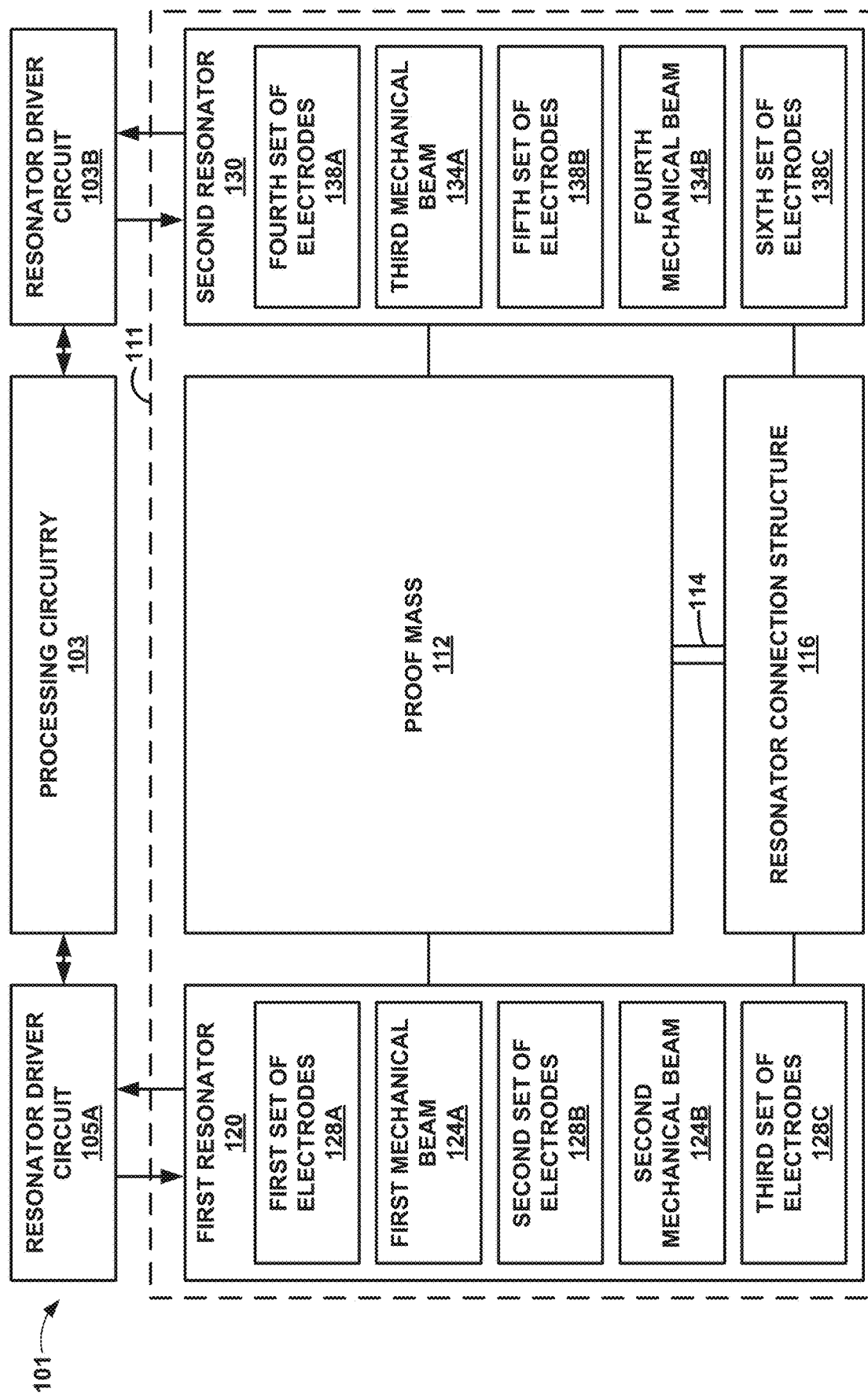
FIG. 3B is a block diagram illustrating an accelerometer system, in accordance with one or more techniques of this disclosure.

FIG. 3B is a block diagram illustrating an accelerometer system 101, in accordance with one or more techniques of this disclosure. As illustrated in FIG. 3B, accelerometer system 101 includes processing circuitry 103, resonator driver circuits 105A-105B (collectively, "resonator driver circuits 105"), and proof mass assembly 111. Proof mass assembly 111 includes proof mass 112, resonator connection structure 116, first resonator 120, and second resonator 130.

First resonator 120 includes first mechanical beam 124A and second mechanical beam 124B (collectively, "mechanical beams 124"), and first set of electrodes 128A, second set of electrodes 128B, and third set of electrodes 128C (collectively, "electrodes 128"). Second resonator 130 includes third mechanical beam 134A and fourth mechanical beam 134B (collectively, "mechanical beams 134"), and fourth set of electrodes 138A, fifth set of electrodes 138B, and sixth set of electrodes 138C (collectively, "electrodes 138").

Accelerometer system 101 may, in some examples, be configured to determine an acceleration associated with an object (not illustrated in FIG. 3B) based on a measured vibration frequency of one or both of first resonator 120 and second resonator 130 which are connected to proof mass 112. In some cases, the vibration of first resonator 120 and second resonator 130 is induced by drive signals emitted by resonator driver circuit 105A and resonator driver circuit 105B, respectively. In turn, first resonator 120 may output a first set of sense signals and second resonator 130 may output a second set of sense signals and processing circuitry 103 may determine an acceleration of the object based on the first set of sense signals and the second set of sense signals.

Processing circuitry 103, in some examples, may include one or more processors that are configured to implement functionality and/or process instructions for execution within accelerometer system 101. For example, processing circuitry 103 may be capable of processing instructions stored in a storage device. Processing circuitry 103 may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 103 may include any suitable structure, whether in hardware, software, firmware, or any combination thereof, to perform the functions ascribed herein to processing circuitry 103.

A memory (not illustrated in FIG. 3B) may be configured to store information within accelerometer system 101 during operation. The memory may include a computer-readable storage medium or computer-readable storage device. In some examples, the memory includes one or more of a short-term memory or a long-term memory. The memory may include, for example, random access memories (RAM), dynamic random access memories (DRAM), static random access memories (SRAM), magnetic discs, optical discs, flash memories, or forms of electrically programmable memories (EPROM) or electrically erasable and programmable memories (EEPROM). In some examples, the memory is used to store program instructions for execution by processing circuitry 103.

In some examples, resonator driver circuit 105A may be electrically coupled to first resonator 120. Resonator driver circuit 105A may output a first set of drive signals to first resonator 120, causing first resonator 120 to vibrate at a resonant frequency. Additionally, in some examples, resonator driver circuit 105A may receive a first set of sense signals from first resonator 120, where the first set of sense signals may be indicative of a mechanical vibration frequency of first resonator 120. Resonator driver circuit 105A may output the first set of sense signals to processing circuitry 103 for analysis. In some examples, the first set of sense signals may represent a stream of data such that processing circuitry 103 may determine the mechanical vibration frequency of first resonator 120 in real-time or near real-time.

In some examples, resonator driver circuit 105B may be electrically coupled to second resonator 130. Resonator driver circuit 105B may output a second set of drive signals to second resonator 130, causing second resonator 130 to vibrate at a resonant frequency. Additionally, in some examples, resonator driver circuit 105B may receive a second set of sense signals from second resonator 130, where the second set of sense signals may be indicative of a mechanical vibration frequency of first resonator 130. Resonator driver circuit 105B may output the second set of sense signals to processing circuitry 103 for analysis. In some examples, the second set of sense signals may represent a stream of data such that processing circuitry 103 may determine the mechanical vibration frequency of second resonator 130 in real-time or near real-time.

Proof mass assembly 111 may secure proof mass 112 to resonator connection structure 116 using first resonator 120 and second resonator 130. For example, Proof mass 112 may be secured to resonator connection structure 116 in a first direction with hinge flexure 114. Proof mass 112 may be secured to resonator connection structure 116 in a second direction with first resonator 120 and resonator 130. Proof mass 112 may be configured to pivot about hinge flexure 114, applying pressure to first resonator 120 and second resonator 130 in the second direction. For example, if proof mass 112 pivots towards first resonator 120, proof mass 112 applies a compression force to first resonator 120 and applies a tension force to second resonator 130. If proof mass 112 pivots towards second resonator 130, proof mass 112 applies a tension force to first resonator 120 and applies a compression force to second resonator 130.

An acceleration of proof mass assembly 111 may affect a degree to which proof mass 112 pivots about hinge flexure 114. As such, the acceleration of proof mass assembly 111 may determine an amount of force applied to first resonator 120 and an amount of force applied to second resonator 130. An amount of force (e.g., compression force or tension force) applied to resonators 120, 130 may be correlated with an acceleration vector of proof amass assembly 111, where the acceleration vector is normal to hinge flexure 114.

In some examples, the amount of force applied to first resonator 120 may be correlated with a resonant frequency in which first resonator 120 vibrates in response to resonator driver circuit 105A outputting the first set of drive signals to first resonator 120. For example, first resonator 120 may include mechanical beams 124. In this way, first resonator 120 may represent a double-ended tuning fork (DETF) structure, where each mechanical beam of mechanical beams 124 vibrate at the resonant frequency in response to receiving the first set of drive signals. Electrodes 128 may generate electrical signals indicative of a mechanical vibration frequency of first mechanical beam 124A and a mechanical vibration frequency of second mechanical beam 124B. For example, the first set of electrodes 128A may generate a first electrical signal, the second set of electrodes 128B may generate a second electrical signal, and the third set of electrodes 128C may generate a third electrical signal. Electrodes 128 may output the first electrical signal, the second electrical signal, and the third electrical signal to processing circuitry 103.

Processing circuitry 103 may determine a difference between the first electrical signal and the second electrical signal and determine the mechanical vibration frequency of first mechanical beam 124A based on the difference between the first electrical signal and the second electrical signal. Additionally, or alternatively, processing circuitry 103 may determine a difference between the second electrical signal and the third electrical signal and determine the mechanical vibration frequency of second mechanical beam 124B based on the difference between the second electrical signal and the third electrical signal. In some examples, the mechanical vibration frequency of the first mechanical beam 124A and the second mechanical beam 124B are substantially the same when resonator driver circuit 105A outputs the first set of drive signals to first resonator 120. For example, the mechanical vibration frequency of first mechanical beam 124A and the mechanical vibration frequency of second mechanical beam 124B may both represent the resonant frequency of first resonator 120, where the resonant frequency is correlated with an amount of force applied to first resonator 120 by proof mass 112. The amount of force that proof mass 112 applies to first resonator 120 may be correlated with an acceleration of proof mass assembly 111 relative to a long axis of resonator connection structure 116. As such, processing circuitry 103 may calculate the acceleration of proof mass 112 relative to the long axis of resonator connection structure 116 based on the detected mechanical vibration frequency of mechanical beams 124.

In some examples, the amount of force applied to second resonator 130 may be correlated with a resonant frequency in which second resonator 130 vibrates in response to resonator driver circuit 105B outputting the second set of drive signals to second resonator 130. For example, second resonator 130 may include mechanical beams 134. In this way, second resonator 130 may represent a double-ended tuning fork (DETF) structure, where each mechanical beam of mechanical beams 134 vibrate at the resonant frequency in response to receiving the second set of drive signals. Electrodes 138 may generate electrical signals indicative of a mechanical vibration frequency of third mechanical beam 134A and a mechanical vibration frequency of fourth mechanical beam 134B. For example, the fourth set of electrodes 138A may generate a fourth electrical signal, the fifth set of electrodes 138B may generate a fifth electrical signal, and the sixth set of electrodes 138C may generate a sixth electrical signal. Electrodes 138 may output the fourth electrical signal, the fifth electrical signal, and the sixth electrical signal to processing circuitry 103.

Processing circuitry 103 may determine a difference between the fourth electrical signal and the fifth electrical signal and determine the mechanical vibration frequency of third mechanical beam 134A based on the difference between the fourth electrical signal and the fifth electrical signal. Additionally, or alternatively, processing circuitry 103 may determine a difference between the fifth electrical signal and the sixth electrical signal and determine the mechanical vibration frequency of fourth mechanical beam 134B based on the difference between the fifth electrical signal and the sixth electrical signal. In some examples, the mechanical vibration frequency of the third mechanical beam 134A and the fourth mechanical beam 134B are substantially the same when resonator driver circuit 105B outputs the second set of drive signals to second resonator 130. For example, the mechanical vibration frequency of third mechanical beam 134A and the mechanical vibration frequency of fourth mechanical beam 134B may both represent the resonant frequency of second resonator 130, where the resonant frequency is correlated with an amount of force applied to second resonator 130 by proof mass 112. The amount of force that proof mass 112 applies to second resonator 130 may be correlated with an acceleration of proof mass assembly 111 relative to a long axis of resonator connection structure 116. As such, processing circuitry 103 may calculate the acceleration of proof mass 112 relative to the long axis of resonator connection structure 116 based on the detected mechanical vibration frequency of mechanical beams 134.

In some cases, processing circuitry 103 may calculate an acceleration of proof mass assembly 111 relative to the long axis of resonator connection structure 116 based on a difference between the detected mechanical vibration frequency of mechanical beams 124 and the detected mechanical vibration frequency of mechanical beams 134. When proof mass assembly 111 accelerates in a first direction along the long axis of resonator connection structure 116, proof mass 112 pivots towards first resonator 120, causing proof mass 112 to apply a compression force to first resonator 120 and apply a tension force to second resonator 130. When proof mass assembly 111 accelerates in a second direction along the long axis of resonator connection structure 116, proof mass 112 pivots towards second resonator 130, causing proof mass 112 to apply a tension force to first resonator 120 and apply a compression force to second resonator 130. A resonant frequency of a resonator which is applied a first compression force may be greater than a resonant frequency of the resonator which is applied a second compression force, when the first compression force is less than the second compression force. A resonant frequency of a resonator which is applied a first tension force may be greater than a resonant frequency of the resonator which is applied a second tension force, when the first tension force is greater than the second tension force.

Although accelerometer system 101 is illustrated as including resonator connection structure 116, in some examples not illustrated in FIG. 3B, proof mass 112, first resonator 120, and second resonator 130 are not connected to a resonator connection structure. In some such examples, proof mass 112, first resonator 120, and second resonator 130 are connected to a substrate. For example, hinge flexure 114 may fix proof mass 112 to the substrate such that proof mass 112 may pivot about hinge flexure 114, exerting tension forces and/or compression forces on first resonator 120 and second resonator 130.

In some examples, the difference between the resonant frequency of first resonator 120 and the resonant frequency of second resonator 130 may have a near linear relationship with the acceleration proof mass assembly 111. In some examples, the relationship between the difference in resonant frequencies of resonators 120, 130 and the acceleration of proof mass assembly 111 might not be perfectly linear. For example, the relationship may include a quadratic nonlinearity coefficient ($K_2$) representing a nonlinearity in the relationship between the difference in the resonant frequencies of resonators 120, 130 and the acceleration of proof mass assembly 111. It may be beneficial for the quadratic nonlinearity coefficient to be zero or close to zero so that processing circuitry 103 is configured to accurately determine the acceleration of proof mass assembly 111 based on the relationship between the difference in resonant frequencies of resonators 120, 130 and the acceleration of proof mass assembly 111. One type of error is as vibration rectification error (VRE). VRE may be as a change in zero-g output, or accelerometer bias, that occurs during vibration. VRE may be caused by nonlinearity in an accelerometer input-to-output transfer function. Typically, the most dominant source is the quadratic nonlinearity coefficient ($K_2$). In order to avoid VRE, it may be beneficial to mitigate this quadratic nonlinearity.

Additionally, it may be beneficial for a difference between the resonant frequency of first resonator 120 and the resonant frequency of second resonator 130 to be nonzero while an acceleration of proof mass assembly 111 is zero m/s². It may be beneficial for the difference in respective resonant frequencies of resonators 120, 130 to be nonzero while proof mass assembly 111 is not accelerating in order to decrease an interference between first resonator 120 and second resonator 130 as compared with systems in which a difference, at zero acceleration, in respective resonant frequencies of a first resonator and a second resonator is zero or closer to zero than the system described herein.

In some examples, accelerometer system 101 may ensure that the quadratic nonlinearity coefficient is close to zero and ensure that the zero-acceleration difference in the respective resonant frequencies of resonators 120, 130 is nonzero by including added masses on first resonator 120. For example, first mechanical beam 124A and second mechanical beam 124B may each include one or more added masses, where the one or more added masses affect the resonant frequency of first resonator 120 and the quadratic nonlinearity coefficient. Third mechanical beam 134A and fourth mechanical beam 134B may each form a one or more gaps where the added masses are located on first mechanical beam 124A and second mechanical beam 124B. In some examples, first resonator 120 and second resonator 130 are substantially the same except that first resonator 120 includes the added mass on first mechanical beam 124A and the added mass on second mechanical beam 124B, where third mechanical beam 134A includes a gap corresponding to the added mass on first mechanical beam 124A and fourth mechanical beam 134B includes a gap corresponding to the added mass on second mechanical beam 124B. Such differences between the first resonator 120 and the second resonator 130 may ensure that the quadratic nonlinearity coefficient is close to zero (e.g., less than 5 μg/g²) and ensure that the zero-acceleration difference in the respective resonant frequencies of resonators 120, 130 is nonzero.

For VBAs with two identical resonators, even-order nonlinearities (e.g., quadratic nonlinearities, $4^{th}$ order nonlinearities) are common-mode error sources nominally eliminated by differential output. However, mismatched resonators, such as first resonator 120 and second resonator 130, may results in an accelerometer $K_2$ that is not necessarily set to zero. Mismatched resonators may be desirable to avoid operating both resonators at the same frequency. Driving two resonators at similar frequencies may cause the resonators to interfere with each other (mechanically and electrically), which ultimately degrades the output of the VBA. Resonators 120 and 130 may ensure that $K_2$ is zero or close to zero and mitigate such interference which degrades the output of the VBA.

Although accelerometer system 101 is described as having two resonators, in other examples not illustrated in FIG. 3B, an accelerometer system may include less than two resonators or greater than two resonators. For example, an accelerometer system may include one resonator. Another accelerometer system may include four resonators.

Figure 4:
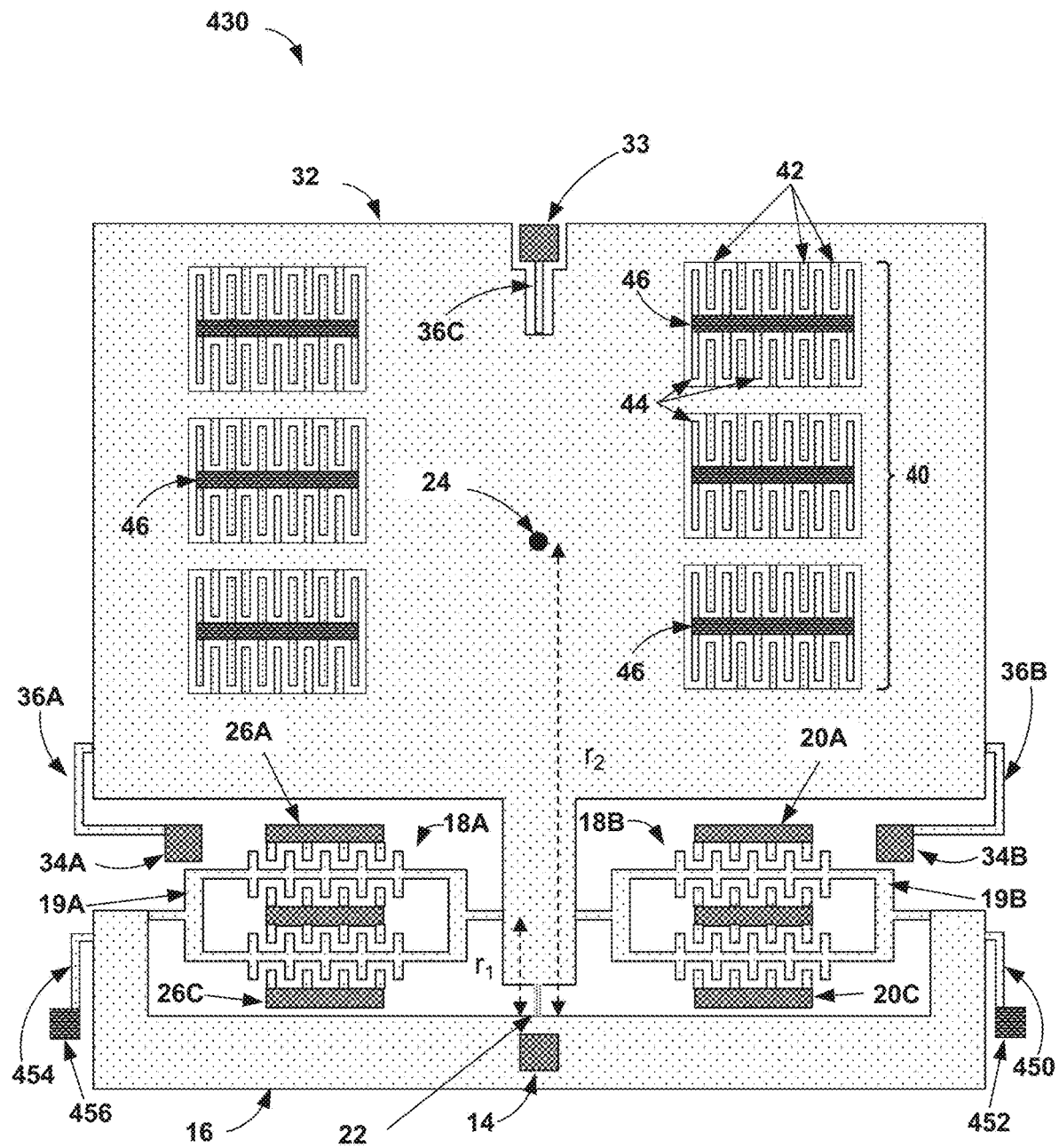
FIG. 4 is a conceptual diagram illustrating a pendulous VBA with supporting flexures configured to avoid nonlinear mechanical coupling.

FIG. 4 is a conceptual diagram illustrating a pendulous VBA with supporting flexures configured to avoid nonlinear mechanical coupling. VBA 430 is an example of VBA 30 and VBA 50 described above in relation to FIGS. 1 and 2. Items in FIG. 4 with the same reference numbers as in FIGS. 1 and 2 have the same description, properties and function as described above. The example of VBA 430 in FIG. 4 includes damping combs 40. However, in other examples, VBA 430 may include the additional support flexures to avoid nonlinear mechanical coupling but may have no damping combs 40.

The example of VBA 430 includes additional support flexures 450 and 454 mechanically connected to anchor portions 452 and 456, respectively. Support flexures 450 and 454 also connect to resonator connection structure 16. Support flexures 450 and 454 as well as anchor portions 452 and 456 are similar to the support flexures with flexible portions 36A and 36B and anchor portions 34A and 34B described above in relation to FIG. 1. As with flexible portions 36A and 36B, in other examples, flexible portions 450 and 454 may have different shapes, such as a straight beam or an S-shape and VBA 430 may have more or fewer support flexures.

Additional support flexures 450 and 454 mechanically connected to anchor portions 452 and 456 are examples of additional support flexures designed to avoid nonlinear mechanical coupling. As described above in relation to FIG. 1, VBA control electronics interface with resonator drive and sense electrodes to sustain motion of the vibrating resonator beams 19A and 19B. To achieve sufficient scale factor (measured in Hz/g) and bandwidth, vibrating resonator beams 19A and 19B may be attached between proof mass 32 and a mechanical anchor 14, clamped on both ends with resonator connection structure 16 in manner that approximates a fixed-fixed beam at the frequencies of interest. As a result, resonator beams 19A and 19B may have nonlinear characteristics like those of a fixed-fixed beam. Specifically, when driven to large mechanical amplitudes, the ends of resonator beams 19A and 19B may move (in the direction of the beam axis) at twice the resonant frequency. In the example of FIG. 4, the beam axis for resonators 19A and 19B are along the X-axis. Additional support flexures 450 and 454 may be referred to as anchor support flexures in this disclosure.

Errors in measured acceleration may occur when twice the driven resonator frequency crosses the frequency of another mechanical mode (or eigenvector) of VBA 430. These errors take on a characteristic shape that has previously been referred to as "activity dips" or "centrifuge peaks". The underlying cause of these errors is nonlinear mechanical coupling between the double-frequency motion of the resonator drive mode and other parasitic mechanical modes one or more portions of VBA 430. The techniques of this disclosure may help the designer to avoid mechanical modes at twice the driven resonator frequency, which, in turn, eliminates the nonlinear mechanical coupling.

Anchor support flexures 454 and 450 may include stiffness in the Y-direction, which may be sized and the geometry configured to control the frequency of Y-direction modes associated with the resonator connection structure. In this disclosure, the resonator connection structure may also be referred to as the rigid anchor connection. Likewise, Z-direction stiffness for anchor support flexures 454 and 450 may be sized and the geometry configured to control the frequency of Z-direction modes associated with the rigid anchor connection. X-direction stiffness may be minimized to prevent a CTE mismatch between device and substrate materials, including the support base, from affecting resonator frequency over a temperature range. As shown in FIG. 4, the X-direction is parallel to the long axis of resonator connection structure 16, the Y-direction is perpendicular to the long axis of the resonator connection structure 16. The Z-direction is perpendicular to both the X-direction and the Y-direction and extends out of the plane that includes, for example, proof mass 32, resonators 18 and resonator connection structure 16.

In some examples, modal analysis performed with finite element analysis may leave a double frequency, or "2f,"

window in the simulated mode frequencies. This frequency window may encompass the expected variation of the driven resonator frequency in response to acceleration. As an example, if the resonators traverse ±10% frequency, the "2f" window may be at least 20%. In examples of accelerometers with two resonators, a larger "2f" window may be useful to accommodate any inherent frequency separation between the two resonators. Similarly, fabrication imperfection and the scale factors of any potential parasitic modes, which may bound the "2f" window, may be considered.

In some examples, anchor support flexures 450 and 454, and the rest of the device geometry, may be manipulated in many different ways to adjust mode frequencies until the "2f" window is sufficiently large. Example adjustments include:

Resonator beam width customized to control resonator frequency.
Modify the outline of the proof mass shape was to tune proof mass mode frequencies.
Add specific holes to the proof mass to increase frequency separation between several proof mass modes. The holes may be defined by edges surrounding material removed from the proof mass. The size, shape and location of the holes may tune the mechanical mode frequencies affected by the proof mass.
Customize glass thickness to alter modes associated with the whole die. Changes to the glass thickness for example, of the proof mass, resonators, and other components of the VBA may alter the frequency of the mechanical modes.

In other words, the entire design may be tailored to create the desired mode frequency spacing. Note that scope of the simulation and design may be extended to cover the entire MEMS die. System-level mechanical modes, such as those manifesting in the circuit board or outer case, typically have too much mass to couple well with double-frequency interactions from the MEMS resonators.

Alternative solutions to the nonlinear coupling may exist, but both example alternatives explained below may have significant disadvantages that preclude their use for the applications of interest. A first alternative may shrink the errors to tolerable levels by reducing the driven amplitude of the resonator(s), e.g. resonators 18A and 18 B. Because the coupling phenomenon is nonlinear, one could simply reduce mechanical amplitude to minimize the effect. While this may be tolerable for larger VBAs or VBAs using more sensitive pick-off methods (e.g. piezoelectric), MEMS VBAs using electrostatic drive and sense may benefit from relatively significant mechanical amplitudes to achieve the desired noise performance. Accelerometer noise may become too high for a MEMS VBA if driven amplitude is reduced to levels that minimize all potential nonlinear mechanical coupling.

A second alternative example may allow only those mechanical modes with insignificant coupling to cross with the double-frequency motion of the driven resonator. In this alternative example, mechanical modes within the structure do not necessarily couple well with the double-frequency motion of the driven resonator. However, the many mechanical modes, even those that are seemingly more benign in this regard, may produce large errors. Furthermore, fabrication imperfection may cause modes that are benign in theory, to still cause significant errors in the final product.

In some example testing of the techniques of this disclosure, measured test results show that techniques of this disclosure that include additional anchor support flexures may successfully eliminates nonlinear mechanical coupling by avoiding mechanical modes that coincide with twice the driven resonator frequency. The anchor support flexures may provide technical benefits such as the anchor support flexures may be designed to provide different stiffnesses in different directions. This flexibility may allow the designer to control the mode frequency distribution to avoid nonlinear mechanical coupling, while avoiding too much stiffness in the X direction. Excessive stiffness in the X-direction may impart CTE mismatch forces on the resonator. The techniques of this disclosure may avoid "centrifuge peaks" of non-linear mechanical coupling without resorting to low drive amplitude, which is detrimental to accelerometer noise, as discussed above.

Figure 5B:
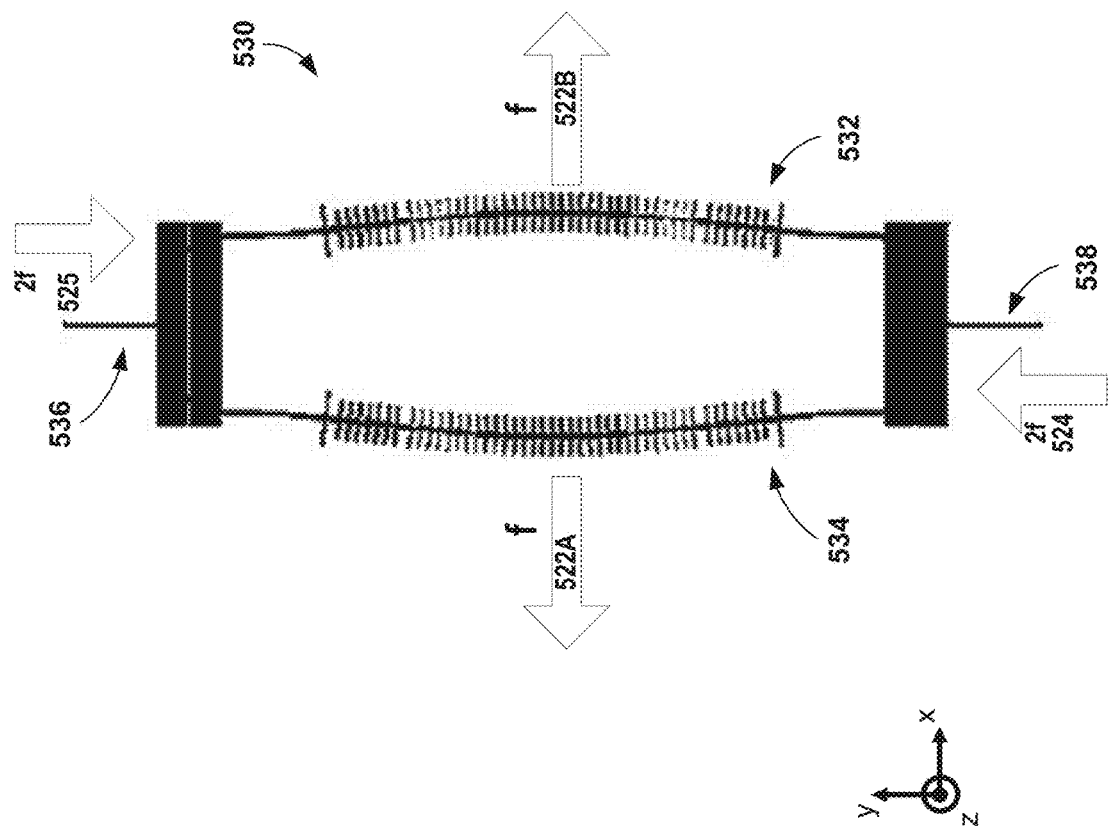
FIG. 5B is a conceptual diagram illustrating the "end-pumping" effect of driving a resonator beam at a resonant frequency, according to one or more techniques of this disclosure.
Figure 5A:
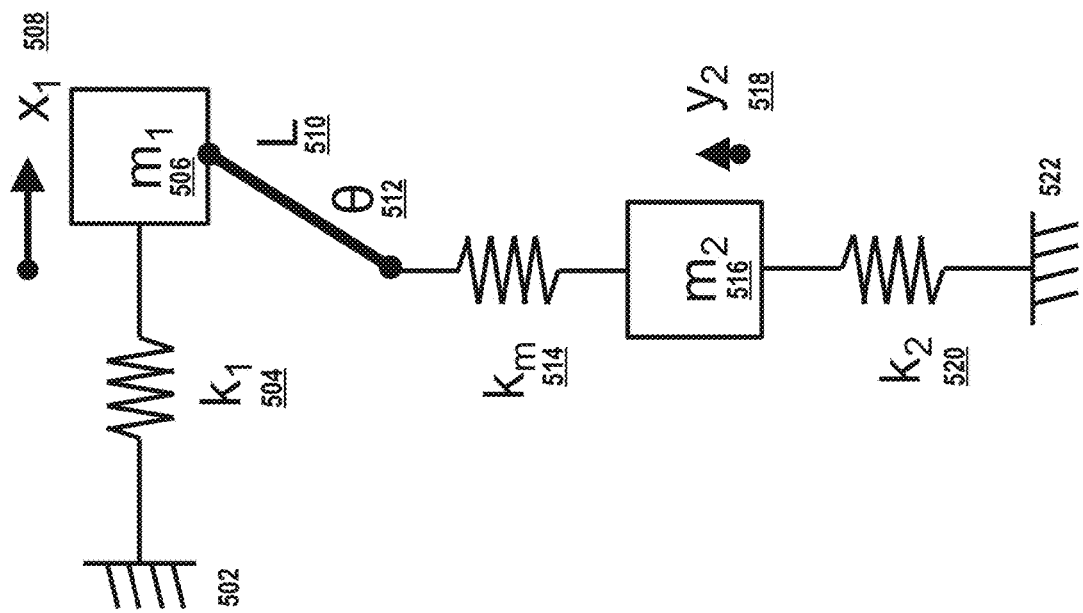
FIG. 5A is a schematic diagram illustrating a mechanical model of a resonator beam of an accelerometer.

FIG. 5A is a schematic diagram illustrating a mechanical model of a resonator beam of an accelerometer. The mechanical model of FIG. 5A is a model showing how the resonator beams interact with the proof mass and may model one of the resonator beams of for example resonator beams 19A described above in relation to FIGS. 1 and 4.

For a resonator beam configured in a fixed-fixed beam, as described above in relation to FIG. 4, mass M1 506 may move along the X-axis in direction X1 508, while mass M2 516 may move along the Y-axis in direction Y2 518, when the resonator beam is being driven by the control electronics. In the example of FIGS. 5A and 5B, the resonators have been rotated 90 degrees compared to the examples of FIGS. 1 and 4, so the X-axis for FIGS. 1 and 4 correspond to the Y-axis of FIGS. 5A and 5B, and vice versa.

In the example of FIG. 5A, mass M1 506 connects to anchor point 502 through a spring with spring constant K1 504. Mass M1 506 connects to mass M2 516 through a spring with spring constant Km 514. Mass M2 connects to anchor point 522 through a spring with spring constant K2 520. Mass M1 is constrained so that it cannot move in Y. Similarly, Mass M2 is constrained so that it cannot move in X. The connecting rod with length L is allowed to pivot at connection to Km and M1. These conditions create the "end-pumping" effect.

In operation, as mass M1 506 moves in direction X1 508, mass M1 506 may move at angle Θ 512 relative to mass M2 516, which applies a force on mass M2 516 in direction Y2 518, away from anchor point 522. The movement of mass M2 516 relative to anchor point 522 may be described as "end-pumping." As mass M1 506 moves back and forth in the X-direction, at the driven frequency f, mass M2 516 may move in the Y-direction at approximately twice the driven frequency, 2f.

FIG. 5B is a conceptual diagram illustrating the "end-pumping" effect of driving a resonator beam at a resonant frequency, according to one or more techniques of this disclosure. Resonator 530 is an example of resonators 18A and 18B described above in relation to FIGS. 1 and 4 and includes resonator beams 534 and 532. Resonator beams 534 and 532 are configured as fixed-fixed beams between anchor points 536 and 538.

The example of FIG. 5A may model, for example, resonator beam 532. For example, the control electronics driving resonator 530 at a frequency, f, may cause a driving force, e.g. driving forces 522A and 522B. Driving forces 522A and 522B may cause end-pumping forces 524 and 525 at twice the driven frequency, 2f.

The non-linear mechanical coupling described above in relation to FIGS. 4, 5A and 5B may be described by the following nonlinear differential equations:

$$\begin{cases} m_1 \frac{d^2 x_1}{dt^2} + b_1 \frac{dx_1}{dt} + k_1 x_1 + k_m x_1 \left( \frac{x_1^2 - L^2 + (L - y_2)\sqrt{L^2 - x_1^2}}{L^2} \right) = F_1 \\ m_2 \frac{d^2 y_2}{dt^2} + b_2 \frac{dy_2}{dt} + (k_2 + k_m) y_2 + k_m \left( \sqrt{L^2 - x_1^2} - L \right) = 0 \end{cases}$$

The terms of the equations coincide with the elements of FIG. 5A above. For example, m1 coincides with mass m1 506 depicted in FIG. 5A. One technique to simplify the above equations is to neglect the damping effects and perform a Taylor series expansion. Dropping the 3$^{rd}$, 4$^{th}$, and 5$^{th}$ order terms results in the following equations:

$$\begin{cases} m_1 \frac{d^2 x_1}{dt^2} + k_1 x_1 - k_m \frac{x_1 y_2}{L} = 0 \\ m_2 \frac{d^2 y_2}{dt^2} + (k_2 + k_m) y_2 - k_m \frac{x_1^2}{2L} = 0 \end{cases}$$

Further assumptions lead to a simplified solution that illustrates a maximum error, which occurs when the frequency of the interfering mode is twice that of the resonator mode. Under the condition in which the proof mass moves at twice the frequency of the resonator, there are two values of resonator frequency (ω) that satisfy the system of non-linear differential equations. The difference between the two values of resonator frequencies that solve the equations is dependent upon the geometry (L), spring constants (k1, k2, km), and driven amplitude of the resonator (A). The frequency difference represents the height of the discontinuity observed in centrifuge measurements (see e.g. 606, in FIG. 6).

$$\begin{cases} \omega \approx \omega_r \pm \omega_r \left( \frac{1}{4\sqrt{2}} \frac{A}{L} \frac{k_m}{\sqrt{k_1} \sqrt{k_2 + k_m}} \right) \\ x_1 \approx A \sin \omega t \\ y_2 \approx \pm A \sqrt{\frac{k_1}{2(k_2 + k_m)}} \cos 2\omega t \end{cases}$$

Figure 6:
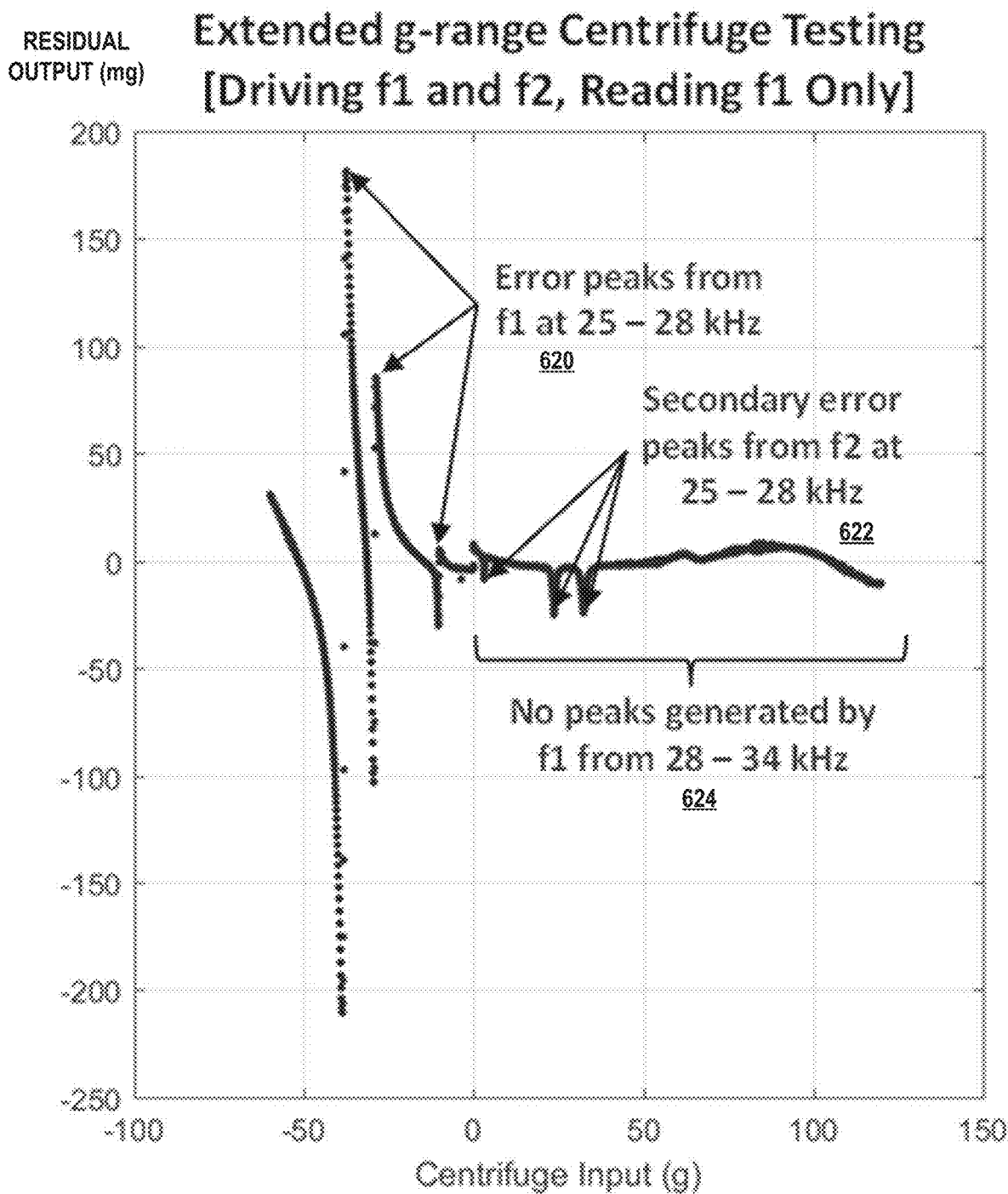
FIG. 6 is a graph illustrating an example of measured centrifuge errors of a VBA of this disclosure.

FIG. 6 is a graph illustrating an example of measured centrifuge errors of a VBA of this disclosure. The graph of FIG. 6 may depict an example of centrifuge errors for a VBA, such as VBA 430 described above in relation to FIG. 4. The graph of FIG. 6 shows the residual output, in mg, for changes in a centrifuge input. The graph shows a comparison of centrifuge peaks when driving a resonator with both a first frequency f1 and a second frequency f2 (604), compared to driving the resonator with the first frequency f1 only (602). As shown in FIG. 6 primary error peaks 606 occur without regard for whether frequency f2 is driving the resonators. The secondary error peaks 608 occur only when frequency f2 is included.

Figure 7:
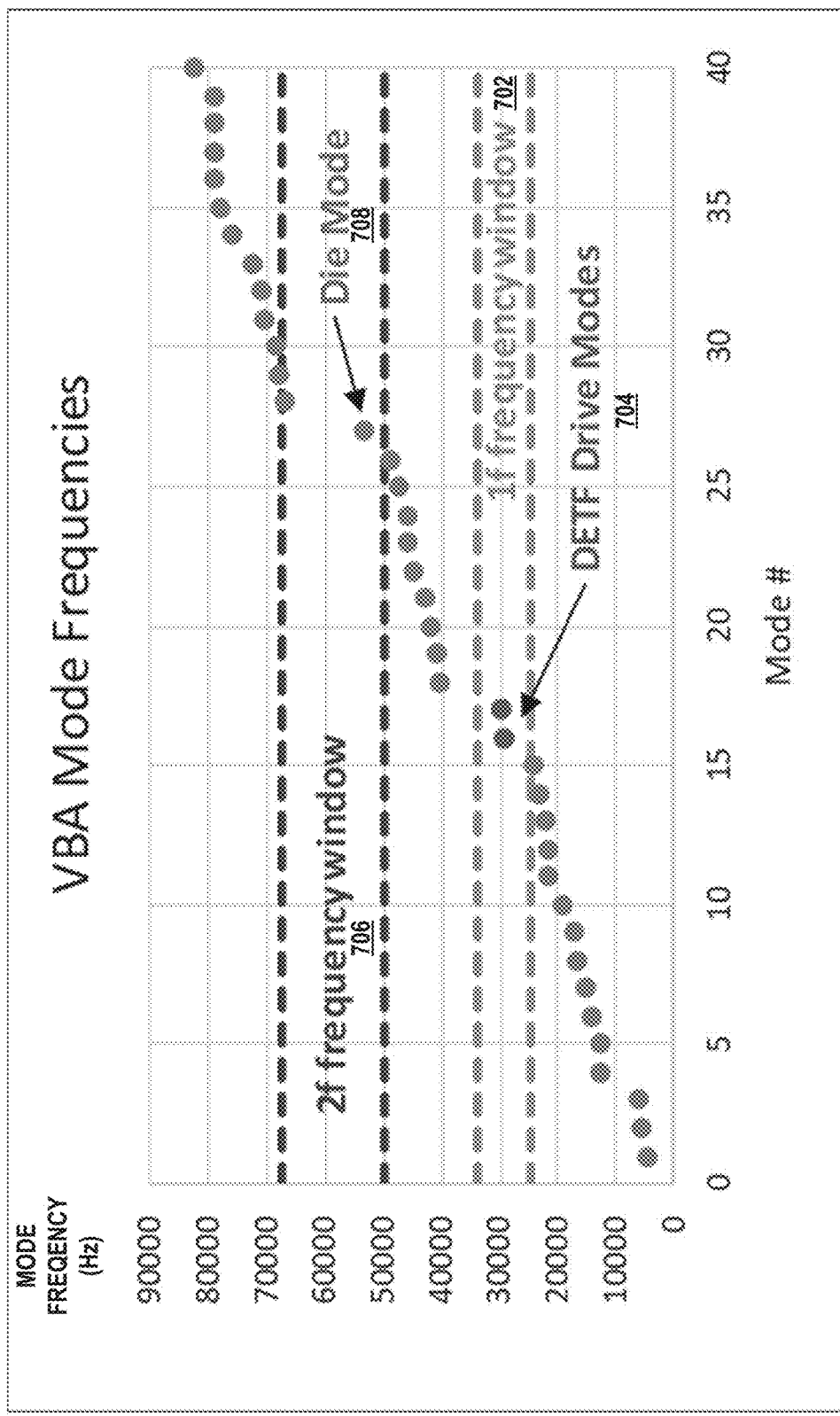
FIG. 7 is a graph illustrating example mode frequencies for a VBA according to one or more techniques of this disclosure.

FIG. 7 is a graph illustrating example mode frequencies for a VBA according to one or more techniques of this disclosure. A VBA, such as VBA 430 described above in relation to FIG. 4, may exhibit mechanical modes at various frequencies. The specific frequencies and modes are just one possible example and other examples may exhibit similar modes at different frequencies. Referring to FIG. 6, the frequencies f1 and f2 may change by approximately ±10% for a typical MEMS VBA over the centrifuge input range shown in FIG. 6, e.g. −60 g to +60 g.

FIG. 7 shows that the resonant frequency window 702 includes double-ended tuning fork (DETF) drive modes 402. The 2f frequency window 706 may be adjusted by, for example, manipulating the geometry of the accelerometer, as described above in relation to FIG. 4. In this manner, the anchor support flexures 450 and 454 depicted in FIG. 4, may ensure that the 2f frequency window 706 avoids mechanical modes of the VBA that may coincide with twice the driven resonator frequency. The orientation, geometry, location of anchor support flexures 450 and 454 may be configured to ensure mechanical modes of VBA 430 move outside 2f frequency window 706. In the example of FIG. 7, only a die mode 708 coincides with 2f frequency window 706.

Figure 8:
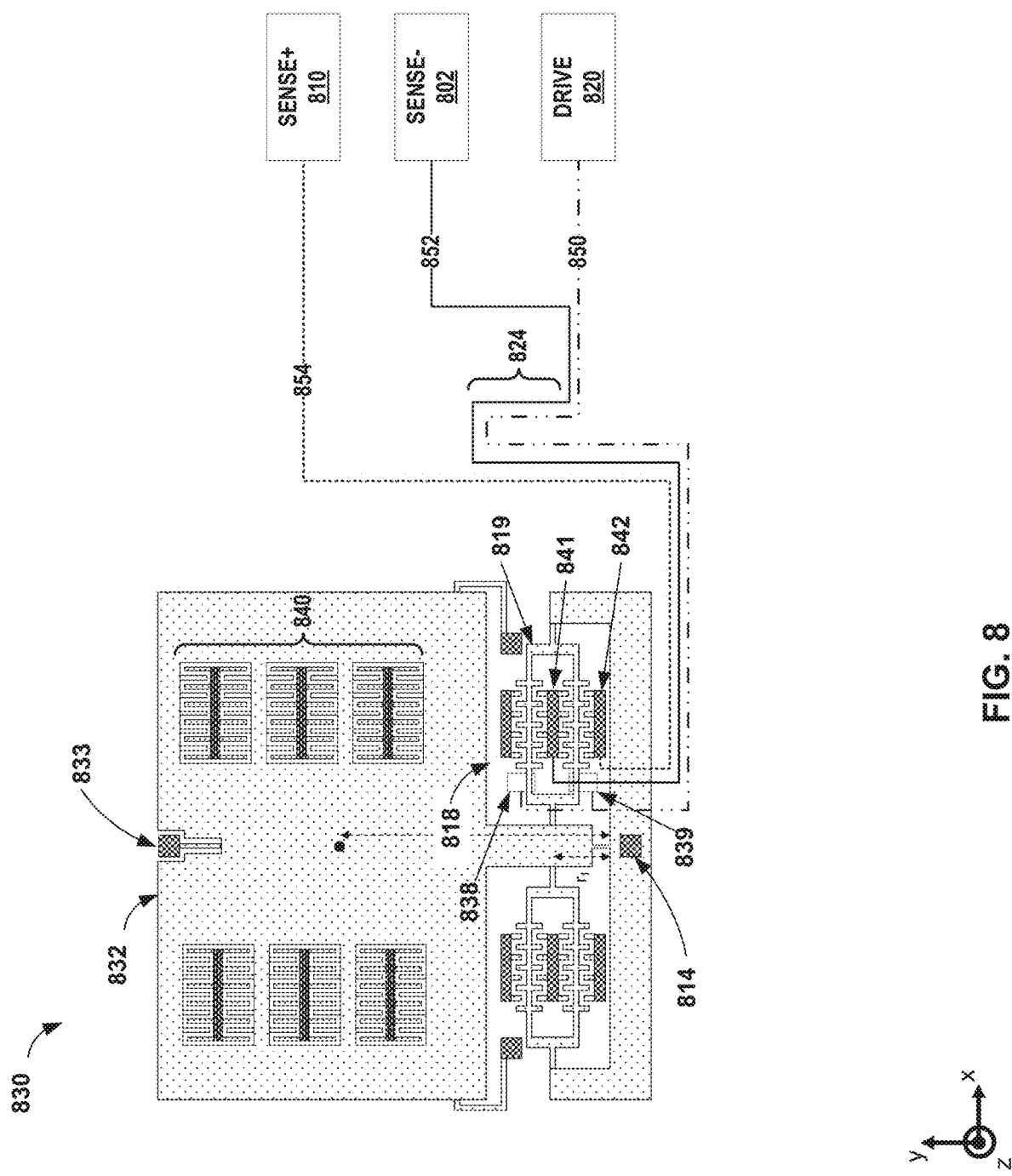
FIG. 8 is a conceptual diagram illustrating an example of resonator electrode placement and routing of electrical signals to avoid the effects of parasitic feedthrough capacitance on accelerometer performance.

FIG. 8 is a conceptual diagram illustrating an example of resonator electrode placement and routing of electrical signals to avoid the effects of parasitic feedthrough capacitance on accelerometer performance. VBA 830 is an example of VBA 30, VBA 50 and VBA 430 described above in relation to FIGS. 1, 2 and 4. Pendulous proof mass 832, resonator 818, resonator beam 819, flexure 833 and mechanical anchor 814, are examples of proof mass 32, resonators 18A and 18B, resonator beams 19A and 19B, flexure 33 and mechanical anchor 14 described above in relation to FIGS. 1 and 4 and therefore may have the same description, properties and function as described above. The example of VBA 830 in FIG. 8 includes damping combs 840. However, in other examples, VBA 830 may have no damping combs 840.

The electrodes and routing within both the electronics and VBA mechanism may create some parasitic capacitance between the drive electrodes and sense electrodes. The example of VBA 830 includes resonator electrodes, such as drive electrodes 838 and 839, configured to mitigate the effects of parasitic capacitance inherent to the VBA resonator. In this manner, provided the feedthrough capacitances between each drive electrode and the sense electrode are similar, the feedthrough currents will be out-of-phase with each other resulting in zero net current.

Control electronics may interface with resonator drive electrodes, such as drive electrode 838 and 839 to sustain motion of the vibrating beam 819. The electrodes and routing within both the electronics and VBA mechanism may create some parasitic capacitance between the drive electrodes and sense electrodes. In the example of FIG. 8, the two different drive electrodes 838 and 839 may receive voltage signals of opposite polarity. Drive electrodes 838 and 839 may be located on both sides of the moving MEMS element, e.g. resonator 818, such that the actuators can push and pull to drive resonator 818. In some examples, drive signals of opposing phase may be generated by analog electronics within control electronics of the VBA. In this manner, provided the feedthrough capacitances between each drive electrode and the sense electrode are similar, the feedthrough currents will be out-of-phase with each other resulting in zero net current.

In some alternative examples, such as a configuration with a single drive and sense electrode, this parasitic feedthrough capacitance may lead to a feedthrough current between the drive electrode and sense electrodes. The feedthrough current may be summed with motional current caused by motion of the mechanical resonator. This total output current is read by the front-end electronics and ultimately used to sustain and sense the frequency of mechanical oscillation. Therefore, the feedthrough current caused by feedthrough capacitance may impact the resonator transfer function and the operation of the VBA.

For moderate feedthrough capacitances, the magnitude and phase of the resonator transfer function may be degraded, which may cause increased accelerometer noise. Stability of the accelerometer bias may be degraded if the resonator is driven too far away from mechanical resonance, since the resonator frequency will be more susceptible to any phase shift in the electronics. Thus, avoiding the effect of this parasitic feedthrough capacitance to may ultimately improve accelerometer performance.

The techniques of this disclosure may include configuring the capacitive comb fingers of resonators 818 into discreet electrodes that include drive electrodes 838 and 839 and two sense electrodes, sense− 856 and sense+ 858. Sense electrodes, sense− 856 and sense+ 858 may be coupled to the anchored portion of resonator 818. Furthermore, the routing of electrical signals 850, 852 and 854 on the die and on the analog electronics board may be configured to produce parasitic feedthrough capacitances, Cf+ and Cf−, that are approximately equal. In some examples, one or more of the electrical signals may include additional routing 824 to ensure that the parasitic feedthrough capacitances, Cf+ and Cf−, are approximately equal. Electrical signals 850, 852 and 854 may connect to terminals such as drive 820, sense− 802 and sense+ 810, respectively.

The two sense electrodes on the VBA may be placed on opposite sides of the moving MEMS resonator beams 819 such that the changes in capacitance with respect to displacement (dCs/dx's) are approximately equal in magnitude and opposite in sign. Then, the sense currents ($i_{s+}$ and $i_{s-}$) will be opposite in sign, but the feedthrough currents ($i_{f+}$ and $i_{f-}$) will be of the same sign. The sense outputs 802 and 810 may connect to a differential front-end amplifier, such as a transimpedance or charge amplifier, which processes the difference in output currents. In this manner the feedthrough currents approximately cancel each other, and the effects may be mitigated.

Alternative solutions may exist to avoid feedthrough capacitance effects, but those alternatives involve additional electronics complexity, which is likely to increase cost. Some example alternatives may include to drive the resonator using a sinusoidal voltage at half the frequency of mechanical resonance. Since electrostatic force is proportional to the square of the voltage, electrostatic actuators can create force at twice the frequency of the sinusoidal voltage. Provided the second harmonic content of the drive signal is small, this alternative solution may eliminate the possibility for drive-to-sense capacitive feedthrough since the drive and sense signals are of different frequencies. However, this alternative solution would likely use a microcontroller within the resonator feedback loop. Adding a digital microcontroller would likely result in an accelerometer that is substantially larger and more expensive than an accelerometer with an analog control loop.

Another alternative example may use two different sense electrodes biased with voltages of opposite polarity. Then, the resulting output currents can be differenced to eliminate the effect of feedthrough capacitance. However, sense electrodes with opposite polarity may have the disadvantage of requiring two large bias voltages instead of just one large bias voltage.

A third alternative may use two different drive electrodes receiving voltage signals of opposite phase. Provided the feedthrough capacitances between each drive electrode and the sense electrode are similar, the feedthrough currents will be out-of-phase with each other resulting in zero net current. This configuration requires drive electrodes on both sides of the moving MEMS element so that the actuators can push and pull to drive the resonator. Drive signals of opposing phase may be generated by the analog electronics and may have a disadvantage of requiring two separate drive circuits.

Measured test results of the resonator configuration techniques of this disclosure show improvement of the open-loop phase response of the analog electronics, which is expected to improve noise and, in some examples, improve bias stability. These techniques may be unique compared to other example techniques because in some examples VBAs typically use one drive and one sense electrode for each resonator. Given a one drive and one sense configuration, there is no means to cancel any feedthrough capacitance that might occur. Rather, other examples may simply attempt to minimize that capacitance.

The technical benefit of the techniques of this disclosure may eliminate or reduce the effect of drive-to-sense feedthrough capacitance. The reduced capacitance may improve the open-loop phase response of the resonator in conjunction with the electronics, which, in turn, enables the electronics to drive the resonator directly at mechanical resonance. In some examples, these techniques may make the accelerometer device easier to integrate with small variances in electronics, which ultimately relaxes requirements on the electronics themselves. Also, prior to development of the read-out electronics, there may have been some concern that this feedthrough capacitance would be detrimental to electronics performance. A read-out circuit is a circuit which may be configured to convert the information on the variation in capacitance caused by an external acceleration into a voltage signal. Test measurements show that cancellation of these feedthrough currents may result in improvements in the open-loop response of the resonators.

The techniques of this disclosure to cancel feedthrough currents may be incorporated into a MEMS VBA. Each resonator 818 may have electrodes wired to its corresponding bond pads. The input to each resonator 818 may be a single drive voltage while the outputs may be configured as two sense electrodes 841 and 842 that contain nominally out-of-phase currents representing physical motion of the MEMS resonators.

In the example of double-ended tuning fork resonators, each resonator has two moving components that oscillate in opposite directions. Drive electrodes, e.g. drive electrodes 838 and 839, may supply a drive voltage that excites mechanical motion at resonance. VBA 830 may include additional drive electrodes not shown in FIG. 8. Positive sense electrodes, e.g. 858, may produce positive current when the two resonator tines move apart. Negative sense electrodes, e.g. 856 may produce positive current when the two resonator tines move together. Thus, the sense electrodes are oriented to have dC/dx's of similar magnitude but opposite sign. Routing of electrical signals 850, 852 and 854 on the MEMS die may be configured to have similar feedthrough capacitance between the drive and sense electrodes.

Figure 9A:
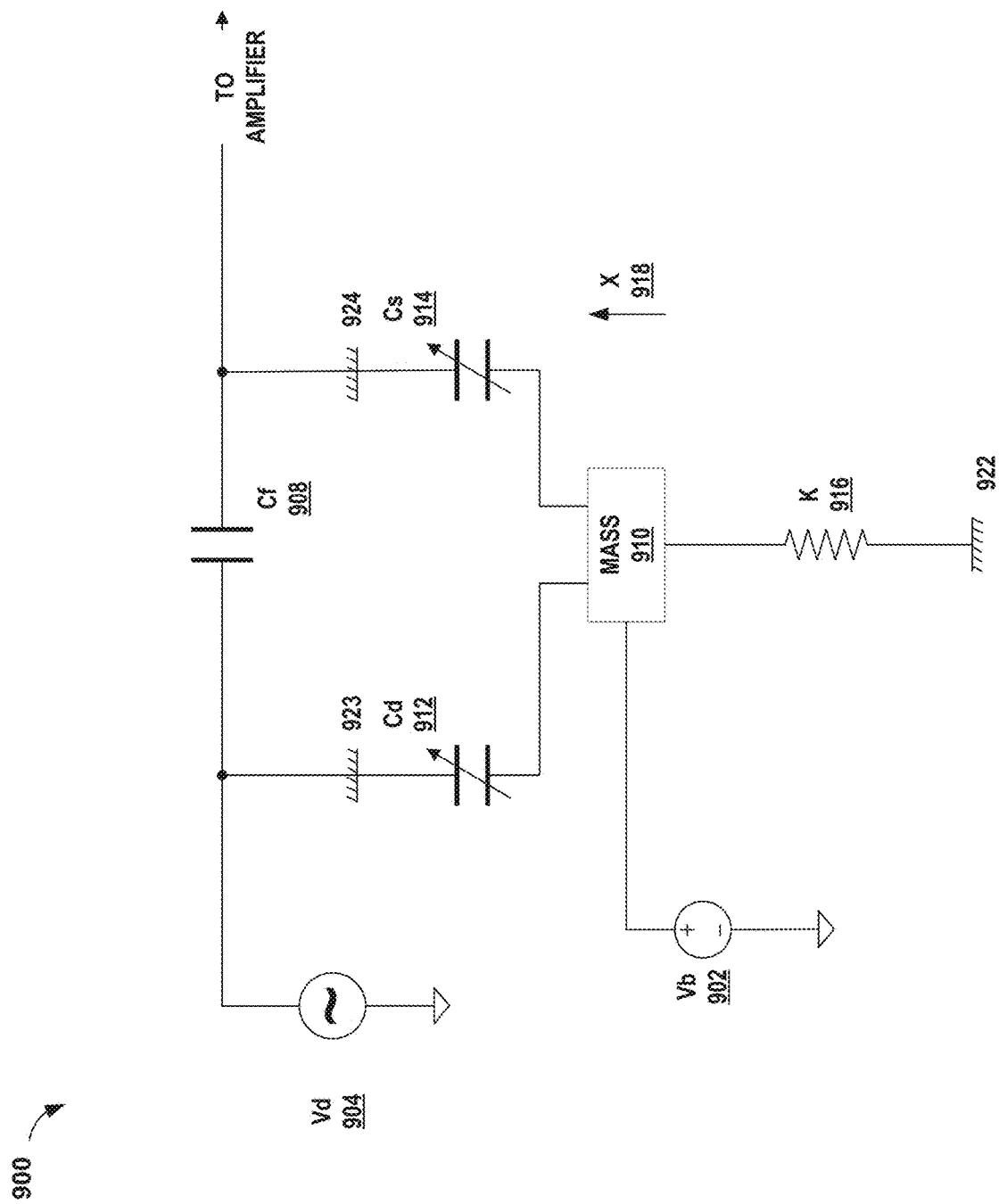
FIGS. 9A and 9B are schematic diagrams illustrating an example MEMS VBA configured with a single sense electrode.
Figure 9B:
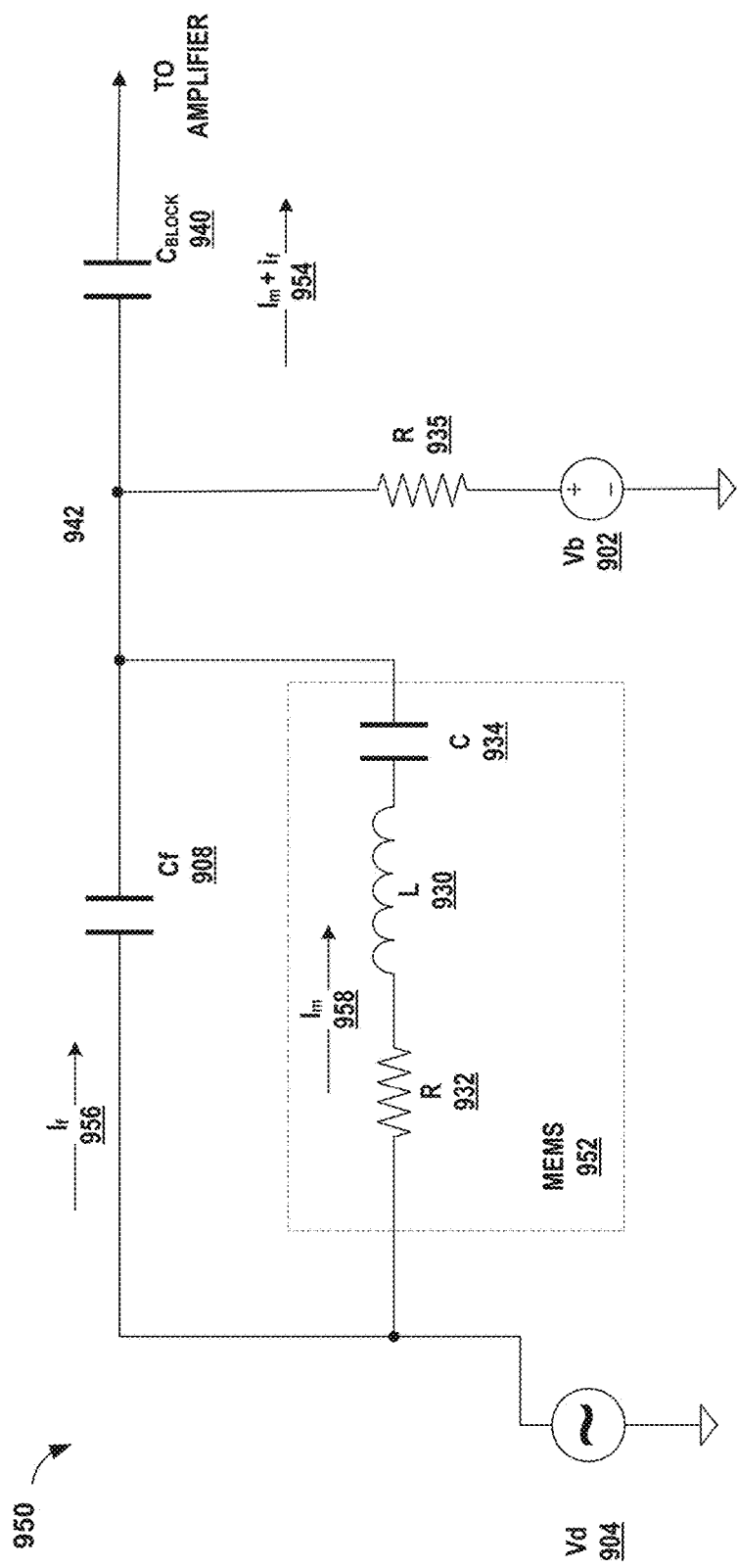

FIGS. 9A and 9B are schematic diagrams illustrating an example MEMS VBA configured with a single sense electrode. FIG. 9A shows a mechanical model of an example single sense electrode VBA and FIG. 9B shows the equivalent electrical circuit.

In the example of FIG. 9A, DC bias voltage Vb 902 connects to a MEMS electrode at mass 910, where mass 910 represents the mass of a resonator beam, not the proof mass of the VBA. Mass 910 connects to attachment point 922 through a spring 916 with spring constant K, to attachment point 923 through variable drive capacitance Cd 912 and to attachment point 924 through variable sense capacitance Cs 914. As described above in relation for example to FIG. 1, the capacitance may change as the resonator tines for the released region moves relative to the resonator tines for the anchored region.

AC drive voltage Vd 904 connects to a drive electrode at attachment point 923 to excite mechanical motion in the resonator and cause mass 910 to move along the X-axis 918. As described above in relation to FIG. 8, electrodes position and signal routing may create some parasitic capacitance, e.g. feedthrough capacitance Cf 908 between the drive electrodes and sense electrodes. In the example configuration of resonator 900, with a single drive and sense electrode, this parasitic feedthrough capacitance Cf 908 may lead to a feedthrough current between the drive electrode and sense electrodes that may be received by an amplifier connected to the VBA.

Circuit 950 in the example of FIG. 9B is an equivalent circuit of resonator 900 described in FIG. 9A. The mass, and other components of resonator 900 may be modeled as the RLC circuit of MEMS 952. MEMS 952 includes resistor R 932 connected in series with inductor L 930 and capacitor C 934. A first terminal of resistor R 932 connects to AC drive voltage Vd 904. A second terminal of resistor R 932 connects to a first terminal of inductor L 930. A second terminal of inductor L 930 connects to a first terminal of capacitor C 934. A second terminal of capacitor C 934 connects to a node 942, which also includes a connection to feedthrough capacitance Cf 908, resistor R 935 and capacitor Cblock 940. The other terminal of Cblock 940 connects to a terminal, which may output a sense signal to an amplifier. Bias voltage Vb 902 connects to the same node 942 through resistor R 935.

Motional current, or sense current, $i_m$ 958, caused by AC drive voltage 904 moves through MEMS 952. The electrode and electrical conductor geometry may cause unwanted feedthrough current if 956. The feedthrough current if 956 adds to the motional current $i_m$ 958 caused by motion of the mechanical resonator at node 942 and is output as $i_m+i_f$ 954 to an amplifier. This total output current may read by the front-end electronics. The total current may cause the resonator transfer function to be degraded, which may cause increased accelerometer noise. The additional feedthrough current may degrade stability of the accelerometer bias if the resonator is driven far away from mechanical resonance.

Figure 10A:
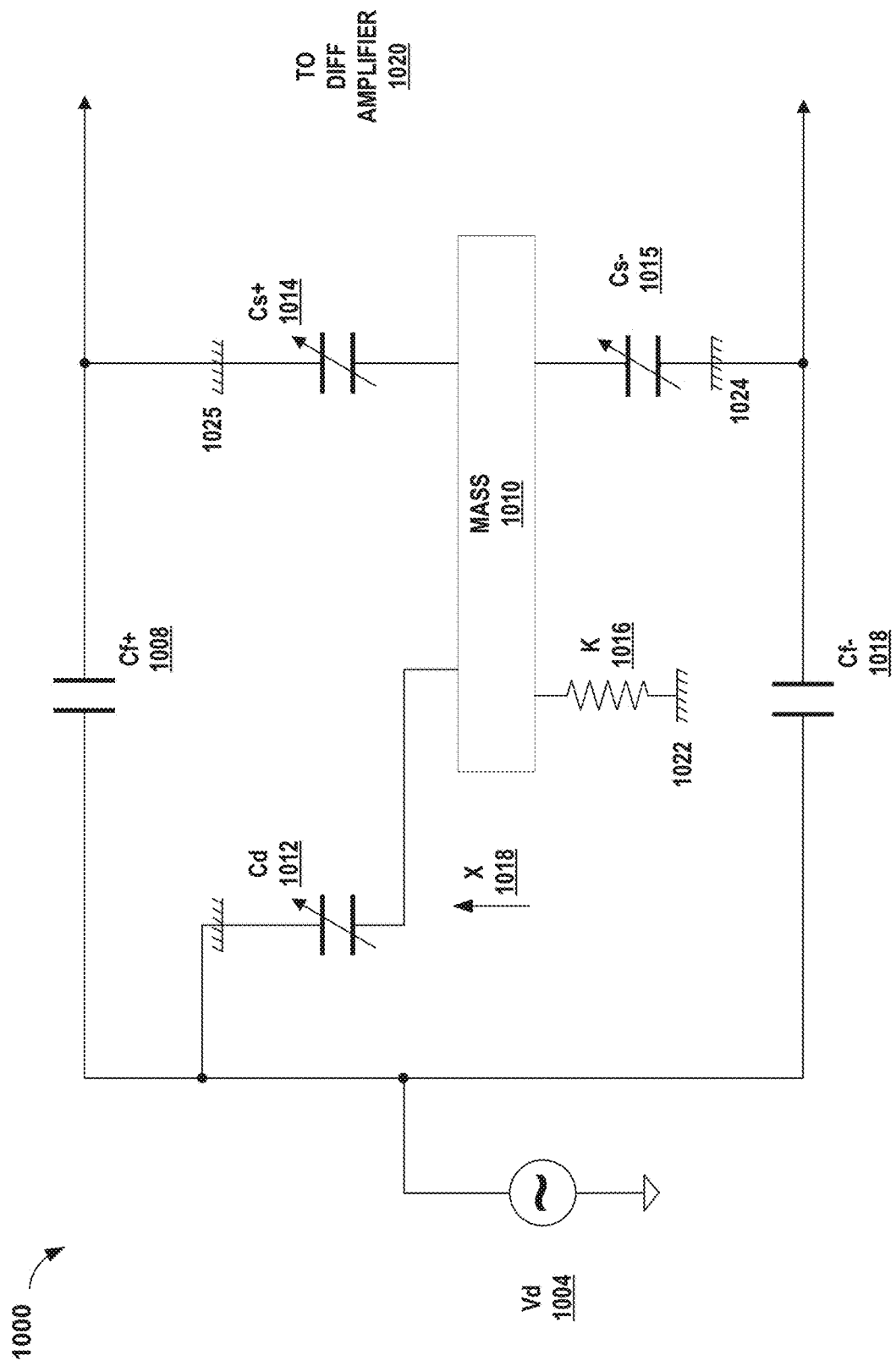
FIGS. 10A and 10B are schematic diagrams illustrating an example MEMS VBA configured with two sense electrodes according to one or more techniques of this disclosure.
Figure 10B:
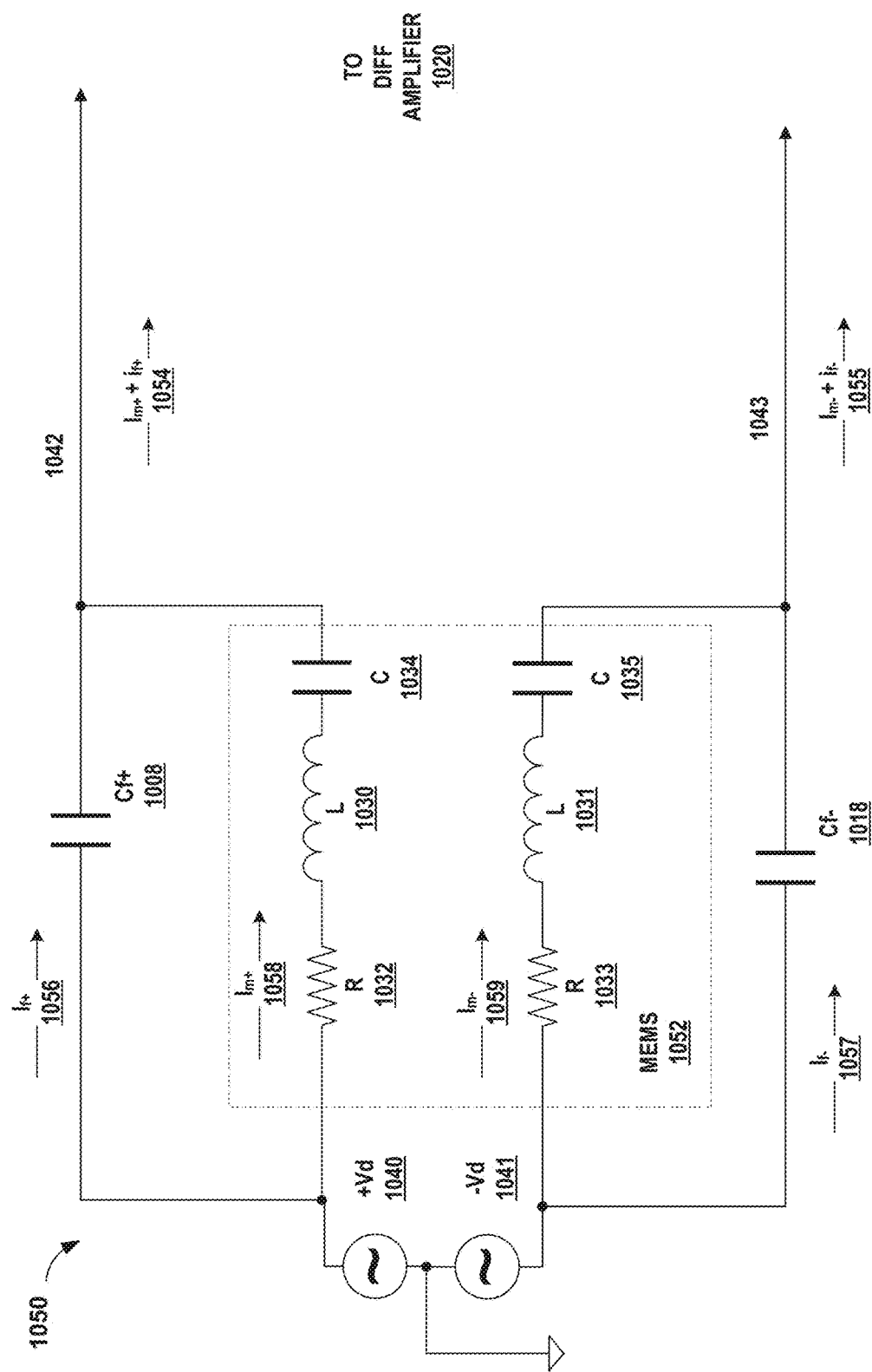

FIGS. 10A and 10B are schematic diagrams illustrating an example MEMS VBA configured with two sense electrodes. FIG. 10A shows a mechanical model of an example single sense electrode VBA and FIG. 10B shows the equivalent electrical circuit. The arrangement of resonator 1000, and circuit 1050, may cancel at least some of the unwanted feedthrough current and reduce the effects of feedthrough capacitance.

In the example of FIG. 10A, mass 1010 connects to attachment point 1022 through a spring 1016 with spring constant K and connects to attachment point 1023 through variable drive capacitance Cd 1012. For the sense electrodes, mass 1010 connects to attachment point 1024 through variable sense capacitance Cs– 1015 and to attachment point 1025 through variable sense capacitance Cs+ 1014.

AC drive voltage Vd 1004 connects to a drive electrode at attachment point 1023 to excite mechanical motion in the resonator and cause mass 1010 to move along the X-axis 1018. As described above in relation to FIG. 8, electrodes position and signal routing may create some parasitic capacitance between the drive electrodes and sense electrodes. In the example of resonator 1000, positive feedthrough capacitance Cf+ 1008 may be caused by parasitic capacitance between the drive circuitry and the sense circuitry that includes Cs+ 1014. Negative feedthrough capacitance Cf– 1018 may be caused by parasitic capacitance between the drive circuitry and the sense circuitry that includes Cs– 1015.

As described above in relation to FIG. 8, positive sense electrodes for a resonator, represented by Cs+ 1014, may produce positive current when resonator tines move apart. Negative sense electrodes, represented by Cs– 1015, may produce positive current when resonator tines move together. Thus, the sense electrodes are oriented to have dC/dx's of similar magnitude but opposite sign. Routing of electrical signals 850, 852 and 854 on the MEMS die may be configured to have similar feedthrough capacitance between the drive and both positive and negative sense electrodes such that Cf+ 1008 and Cf– 1018 are approximately equal. Approximately equal in this disclosure means equal within manufacturing and measurement tolerances. Small variations during manufacturing in materials, process, and so on may cause small differences such that, for example, Cf– 1018 and Cf+ 1008 may be approximately equal rather than exactly equal. The sense outputs from resonator 1000 may be processed by a differential amplifier 1020 so that the positive and negative feedthrough currents may approximately cancel each other.

In the example of FIG. 10B, circuit 1050 is an equivalent circuit of resonator 1000 described in FIG. 10A. The mass, and other components of resonator 900 may be modeled as two RLC circuits of MEMS 1052. For the positive sense branch, MEMS 1052 includes resistor R 1032 connected in series with inductor L 1030 and capacitor C 1034. A first terminal of resistor R 1032 connects to AC drive voltage +Vd 1040. A second terminal of resistor R 1032 connects to a first terminal of inductor L 1030. A second terminal of inductor L 1030 connects to a first terminal of capacitor C 1034. A second terminal of capacitor C 1034 connects to output node 1042, which also includes a connection to feedthrough capacitance Cf+ 1008. AC drive voltage +Vd 1040 and AC drive voltage –Vd 1041 indicate that the drive voltages are opposite in phase. Though depicted as two separate AC sources in the example of circuit 1050, in other examples, a single AC source may provide the drive signal and analog circuitry, for example, may output AC drive signals of opposite phase. For example, resonator drive circuits 103A, 103B, 104A and 104B described above in relation to FIGS. 3A and 3B, may include AC drive circuitry configured to provide drive signals to the resonators that are of opposite phase.

For the negative sense branch, MEMS 1052 includes resistor R 1033 connected in series with inductor L 1031 and capacitor C 1035. A first terminal of resistor R 1033 connects to AC drive voltage –Vd 1041. A second terminal of resistor R 1033 connects to a first terminal of inductor L 1031. A second terminal of inductor L 1031 connects to a first terminal of capacitor C 1035. A second terminal of capacitor C 1035 connects to output node 1043, which also includes a connection to feedthrough capacitance Cf– 1018.

Motional current caused by AC drive voltages 1040 and 1041 moves through both the positive branch of MEMS 1052, which includes R1032, e.g. $i_{m+}$ 1058, and through the negative branch, which includes R 1033, e.g. $i_{m-}$ 1059. The electrode and electrical conductor geometry may cause unwanted feedthrough currents $i_{f+}$ 1056 and $i_{f-}$ 1057. On the positive side, feedthrough current $i_{f+}$ 1056 adds to the motional current $i_{m+}$ 1058 caused by motion of the mechanical resonator and is output as $i_{m\_}+i_{f+}$ 1054 to one input of a differential amplifier 1020. On the negative side, feedthrough current $i_{f-}$ 1057 adds to the motional current $i_{m-}$ 1059 and is output as $i_{m\_}+i_{f+}$ 1055 to a second input of the differential amplifier 1020. In equation form, the result may be described as:

positive and negative sense currents are approximately equal: $i_{m+}=-i_{m-}$ positive and negative feedthrough capacitance are approximately equal:

$$C_{f+}=C_{f-} \text{ and } i_{f+}=i_{f-}$$

therefore, the output of the differential amplifier is:

$$i_{diff}=i_{m+}+i_{f+}-(i_{f-}+i_{m-})=2*i_{m+}$$

Figure 11A:
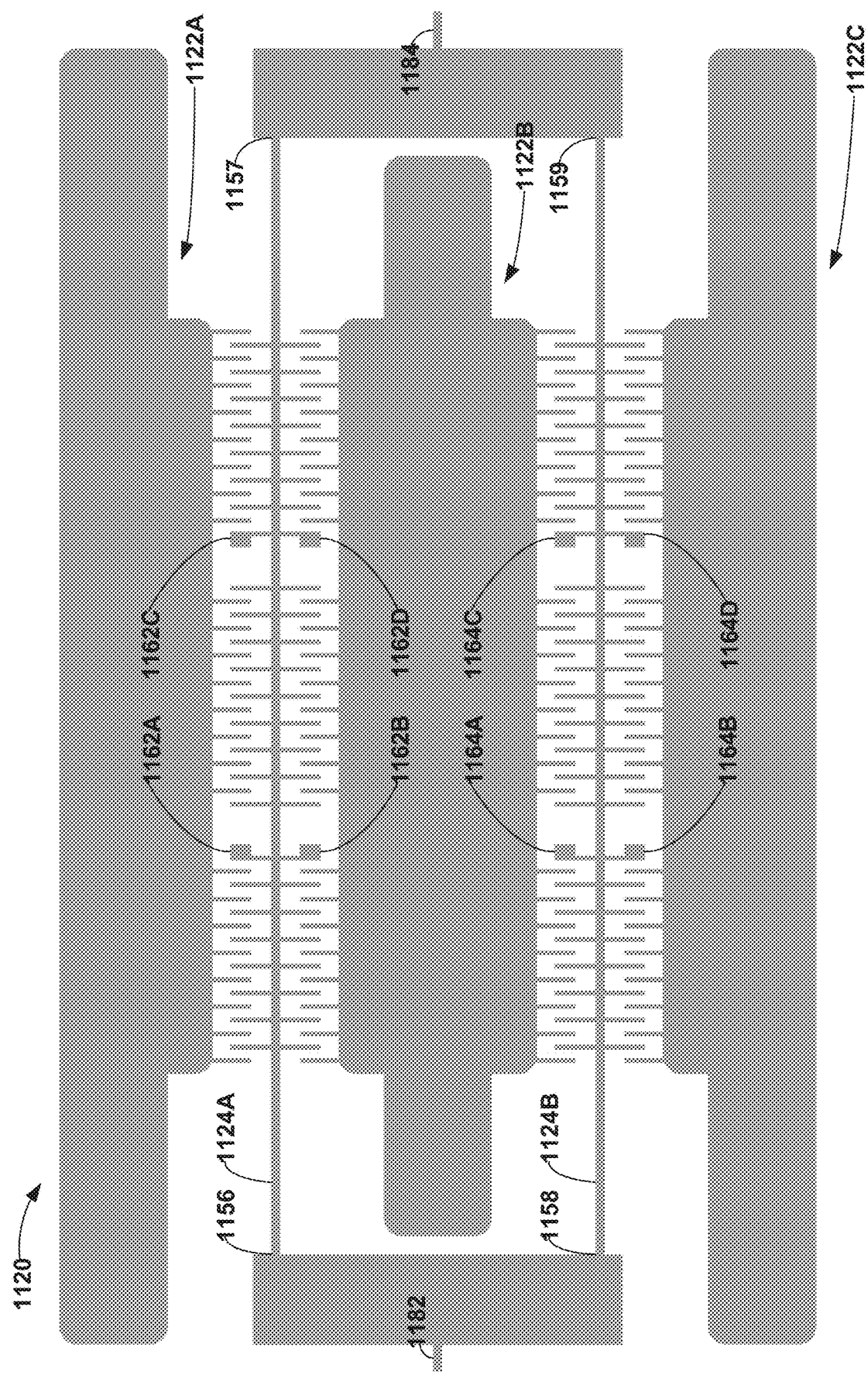
FIG. 11A is a conceptual diagram illustrating a first resonator with added masses, in accordance with one or more techniques of this disclosure.

FIG. 11A is a conceptual diagram illustrating a first resonator 1120 with added masses, in accordance with one or more techniques of this disclosure. First resonator 1120 may be an example of resonators 18 of FIG. 1 and first resonator 120 of FIG. 3B. First resonator 1120 may include anchored combs 1122A-1122C (collectively, "anchored combs 1122"), first mechanical beam 1124A, and second mechanical beam 1124 (collectively, "mechanical beams 1124"). First mechanical beam 1124A may include added masses 1162A-1162D (collectively, "added masses 1162"). Second mechanical beam 1124B may include added masses 1164A-1164D (collectively, "added masses 1164").

In some examples, anchored comb 1122A includes one or more anchored comb sections, anchored comb 1122B includes one or more anchored comb sections, and anchored comb 1122C includes one or more anchored comb sections. In some examples, any one or combination of the anchored comb sections of anchored comb 1122A may include one or more electrodes of a first set of electrodes (e.g., first set of electrodes 128A of FIG. 3B). In some examples, any one or combination of the anchored comb sections of anchored comb 1122B may include one or more electrodes of a second set of electrodes (e.g., second set of electrodes 128A). In some examples, any one or combination of the anchored comb sections of anchored comb 1122C may include one or more electrodes of a third set of electrodes (e.g., third set of electrodes 128C).

In some examples, a resonator driver circuit may deliver a drive signal to first resonator 1120 via any one or combination of the first set of electrodes, the second set of electrodes, and the third set of electrodes, causing first resonator 1120 to vibrate at a resonant frequency. For example, the first mechanical beam 1124A and the second mechanical beam 1124B may vibrate at the resonant frequency. In turn, the first set of electrodes may generate a first electrical signal, the second set of electrodes may generate a second electrical signal, and the third set of electrodes may generate a third electrical signal. First resonator 1120 may output the first electrical signal, the second electrical signal, and the third electrical signal to processing circuitry (not illustrated in FIG. 4A) which is configured to determine the resonant frequency of the first resonator 1120 based on the first electrical signal, the second electrical signal, and the third electrical signal.

In some examples, the resonant frequency of first resonator 1120 may be correlated with an amount of force applied to first resonator 1120 by a proof mass, such as proof mass 32 of FIG. 1 and proof mass 112 of FIG. 3B. For example, a first end 1182 of first resonator 1120 may be fixed to a resonator connection structure (e.g., resonator connection structure 16 of FIG. 1 and resonator connection structure 116 of FIG. 3B) and a second end 1184 of first resonator 1120 may be fixed to the proof mass. If the proof mass rotates towards first resonator 1120 in response to an acceleration in a first direction, the proof mass may apply a compression force to first resonator 1120. If the proof mass rotates away from first resonator 1120 in response to an acceleration in a second direction, the proof mass may apply a tension force to first resonator 1120. In some examples, if acceleration is at zero m/s², the proof mass may apply no force to first resonator 1120. The resonant frequency of first resonator 1120 may decrease as the compression force applied by the proof mass increases in response to an increase in acceleration in the first direction, and the resonant frequency of first resonator 1120 may increase as the tension force applied by the proof mass increases in response to an increase in acceleration in the second direction. In this way, a relationship may exist between the resonant frequency of first resonator 1120 and the acceleration of an accelerometer which includes first resonator 1120.

Added masses 1162 and added masses 1164 may affect the relationship between acceleration and the resonant frequency of first resonator 1120. For example, a quadratic nonlinearity coefficient defining the relationship between the acceleration and the resonant frequency of first resonator 1120 may be smaller as compared with a quadratic nonlinearity coefficient defining a relationship between an acceleration and a resonant frequency of a resonator which does not include added masses 1162 and added masses 1164. It may be beneficial for the relationship between acceleration and the resonant frequency of first resonator 1120 to be as close to linear as possible (e.g., the quadratic nonlinearity coefficient being as small as possible) in order to ensure that the electrical signals generated by first resonator 1120 allow processing circuitry to accurately determine acceleration.

In some examples, added mass 1162A and added mass 1162B may be placed at a location along first mechanical beam 1124A that is within a range from 25% to 45% along a length of first mechanical beam 1124A from first end 1156 to second end 1157. For example, added mass 1162A and added mass 1162B may be placed at a location that is 35% of a distance between first end 1156 to second end 1157. In some examples, added mass 1162C and added mass 1162D may be placed at a location along first mechanical beam 1124A that is within a range from 55% to 75% along a length of first mechanical beam 1124A from first end 1156 to second end 1157. For example, added mass 1162C and added mass 1162D may be placed at a location that is 65% of a distance between first end 1156 to second end 1157.

In some examples, added mass 1164A and added mass 1164B may be placed at a location along second mechanical beam 1124B that is within a range from 25% to 45% along a length of second mechanical beam 1124B from first end 1158 to second end 1159. For example, added mass 1164A and added mass 1164B may be placed at a location that is 35% of a distance between first end 1158 to second end 1159. In some examples, added mass 1164C and added mass 1164D may be placed at a location along second mechanical beam 1124B that is within a range from 55% to 75% along a length of second mechanical beam 1124B from first end 1158 to second end 1159. For example, added mass 1164C and added mass 1164D may be placed at a location that is 65% of a distance between first end 1158 to second end 1159.

FIG. 4B is a conceptual diagram illustrating a portion of first resonator 1120 of FIG. 4A including added masses 1162A and 1162B, in accordance with one or more techniques of this disclosure. For example, first mechanical beam 1124A includes a primary member 1190 and a set of secondary members 1192A-1192D (collectively, "set of secondary members 1192"). As seen in FIG. 4B, each secondary member of the set of secondary members 1192 extends normal to primary member 1190. First mechanical beam 1124A may include additional secondary members and additional other components that are not illustrated in FIG. 4B. Each secondary member of the set of secondary members 1192 may be substantially the same, except that secondary member 1192C includes added mass 1162A and added mass 1162B.

Figure 12A:
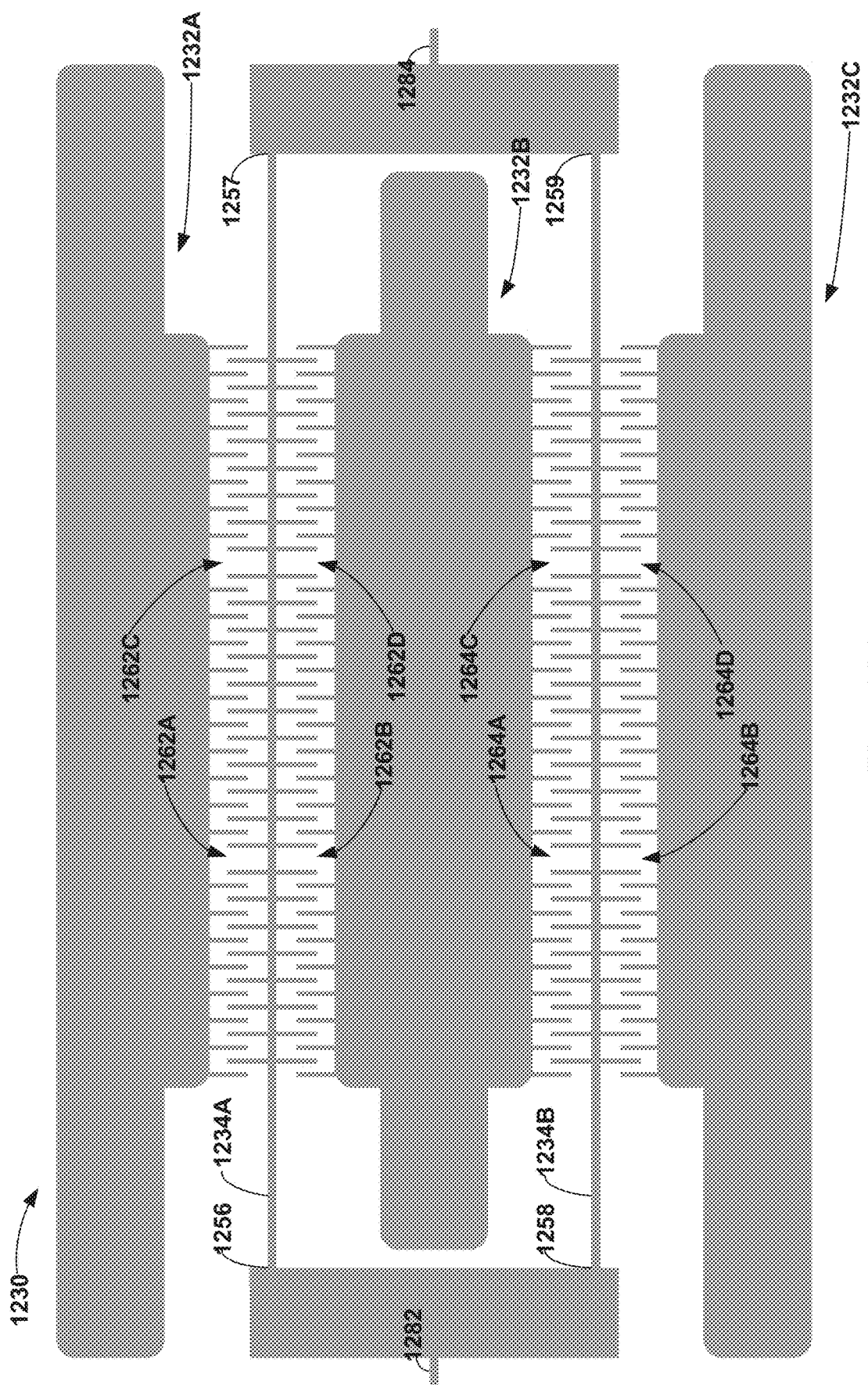
FIG. 12A is a conceptual diagram illustrating a second resonator forming gaps, in accordance with one or more techniques of this disclosure.

FIG. 12A is a conceptual diagram illustrating a second resonator 1230 forming gaps, in accordance with one or more techniques of this disclosure. Second resonator 1230 may be an example of second resonator 130 of FIG. 3B. Second resonator 1230 may include anchored combs 1232A-1232C (collectively, "anchored combs 1232"), third mechanical beam 1234A, and fourth mechanical beam 1234B (collectively, "mechanical beams 1234"). Third mechanical beam 1234A may form gaps 1262A-1262D (collectively, "gaps 1262"). Fourth mechanical beam 1234B may form gaps 1264A-1264D (collectively, "gaps 1264").

In some examples, anchored comb 1232A may include one or more anchored comb sections, anchored comb 1232B may include one or more anchored comb sections, and anchored comb may include one or more anchored comb sections. In some examples, any one or combination of the anchored comb sections of anchored comb 1232A may include one or more electrodes of a fourth set of electrodes (e.g., fourth set of electrodes 138A of FIG. 3B). In some examples, any one or combination of the anchored comb sections of anchored comb 1232B may include one or more electrodes of a fifth set of electrodes (e.g., fifth set of electrodes 138B). In some examples, any one or combination of the anchored comb sections of anchored comb 1232C may include one or more electrodes of a sixth set of electrodes (e.g., sixth set of electrodes 138C).

In some examples, a resonator driver circuit may deliver a drive signal to second resonator 1230 via any one or combination of the fourth set of electrodes, the fifth set of electrodes, and the sixth set of electrodes, causing second resonator 1230 to vibrate at a resonant frequency. For example, the third mechanical beam 1234A and the fourth mechanical beam 1234B may vibrate at the resonant frequency of second resonator 1230. In turn, the fourth set of electrodes may generate a fourth electrical signal, the fifth set of electrodes may generate a fifth electrical signal, and the sixth set of electrodes may generate a sixth electrical signal. Second resonator 1230 may output the fourth electrical signal, the fifth electrical signal, and the sixth electrical signal to processing circuitry (not illustrated in FIG. 12A) which is configured to determine the resonant frequency of the second resonator 1230 based on the fourth electrical signal, the fifth electrical signal, and the sixth electrical signal.

In some examples, the resonant frequency of second resonator 1230 may be correlated with an amount of force applied to second resonator 1230 by a proof mass, such as proof mass 112 of FIG. 3B. For example, a first end 1282 of second resonator 1230 may be fixed to the proof mass and a second end 1284 of second resonator 1230 may be fixed to a resonator connection structure (e.g., resonator connection structure 116 of FIG. 3B). If the proof mass rotates away from second resonator 1230 in response to an acceleration in a first direction, the proof mass may apply a tension force to second resonator 1230. If the proof mass rotates towards second resonator 1230 in response to an acceleration in a second direction, the proof mass may apply a compression force to second resonator 1230. In some examples, if acceleration is at zero m/s$^2$, the proof mass may apply no force to second resonator 1230. The resonant frequency of second resonator 1230 may decrease as the compression force applied by the proof mass increases in response to an increase in acceleration in the second direction, and the resonant frequency of second resonator 1230 may increase as the tension force applied by the proof mass increases in response to an increase in acceleration in the first direction. In this way, a relationship may exist between the resonant frequency of second resonator 1230 and the acceleration of an accelerometer which includes second resonator 1230.

Figure 11B:
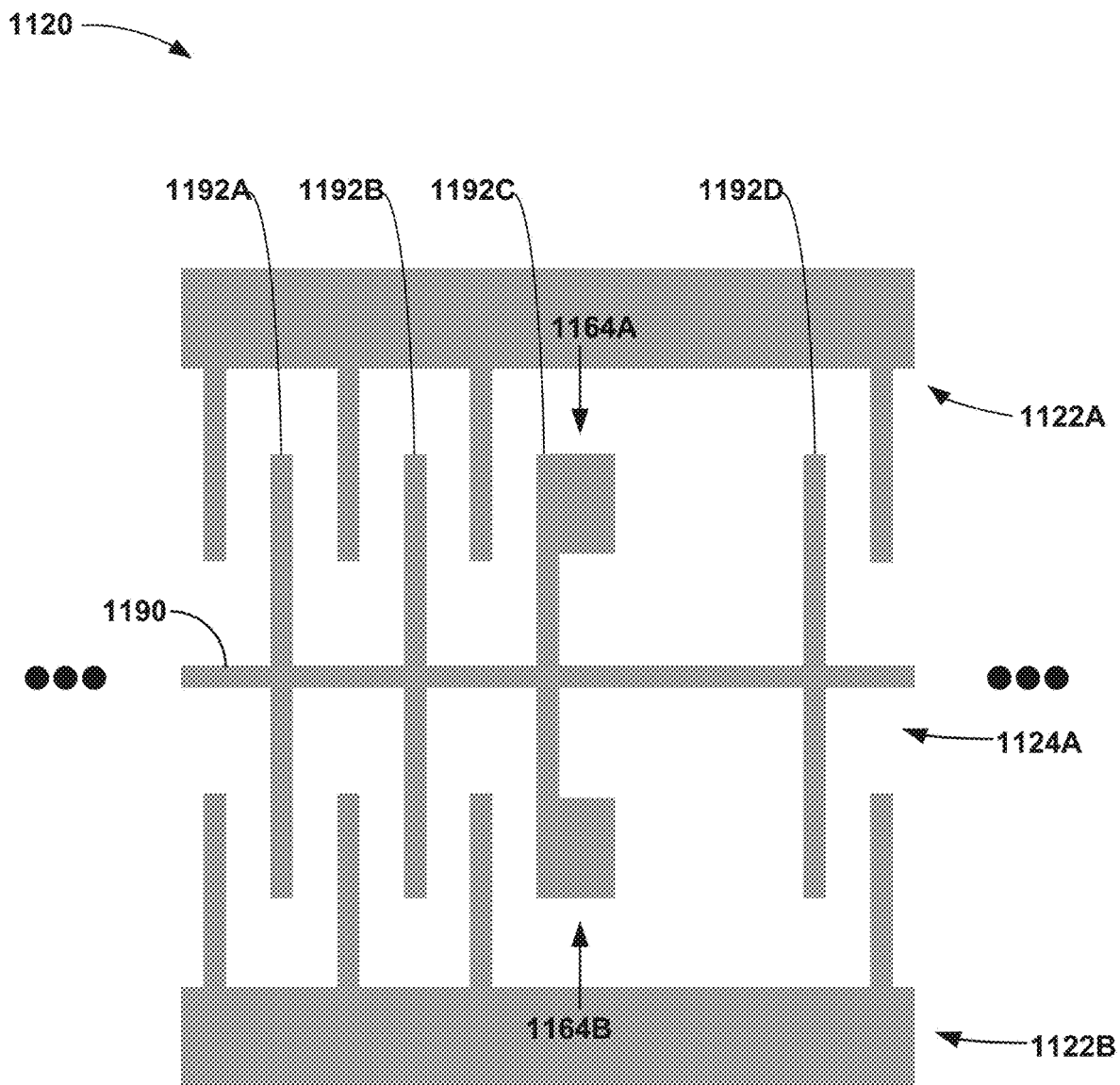
FIG. 11B is a conceptual diagram illustrating a portion of the first resonator of FIG. 4A including added masses, in accordance with one or more techniques of this disclosure.

Gaps 1262 and gaps 1264 may affect the relationship between acceleration and the resonant frequency of second resonator 1230. For example, a quadratic nonlinearity coefficient defining the relationship between the acceleration and the resonant frequency of second resonator 1230 may be smaller as compared with a quadratic nonlinearity coefficient defining a relationship between an acceleration and a resonant frequency of a resonator which does not include gaps 1262 and gaps 1264. It may be beneficial for the relationship between acceleration and the resonant frequency of second resonator 1230 to be as close to linear as possible (e.g., the quadratic nonlinearity coefficient being as small as possible) in order to ensure that the electrical signals generated by second resonator 1230 allow processing circuitry to accurately determine acceleration. In some examples, gaps 1262 represent "holes" where added masses 1162 are included on first resonator 1120 of FIGS. 11A-11B. In some examples, gaps 1264 represent holes where added masses 1164 are included on first resonator 1120 of FIGS. 11A-11B. The gaps or holes for the added masses on the resonators are different than the holes in the proof mass configured to tune mechanical modes, as described above in relation to FIG. 4.

In some examples, gap 1262A and gap 1262B may be placed at a location along third mechanical beam 1234A that is within a range from 25% to 45% along a length of third mechanical beam 1234A from first end 1256 to second end 1257. For example, gap 1262A and gap 1262B may be placed at a location that is 35% of a distance between first end 1256 to second end 1257. In some examples, gap 1262C and gap 1262D may be placed at a location along third mechanical beam 1234A that is within a range from 55% to 75% along a length of third mechanical beam 1234A from first end 1256 to second end 1257. For example, gap 1262C and gap 1262D may be placed at a location that is 65% of a distance between first end 1256 to second end 1257.

In some examples, gap 1264A and gap 1264B may be placed at a location along fourth mechanical beam 1234B that is within a range from 25% to 45% along a length of fourth mechanical beam 1234B from first end 1258 to second end 1259. For example, gap 1264A and gap 1264B may be placed at a location that is 35% of a distance between first end 1258 to second end 1259. In some examples, gap 1264C and gap 1264D may be placed at a location along fourth mechanical beam 1234B that is within a range from 55% to 75% along a length of fourth mechanical beam 1234B from first end 1258 to second end 1259. For example, gap 1264C and gap 1264D may be placed at a location that is 65% of a distance between first end 1258 to second end 1259.

Figure 12B:
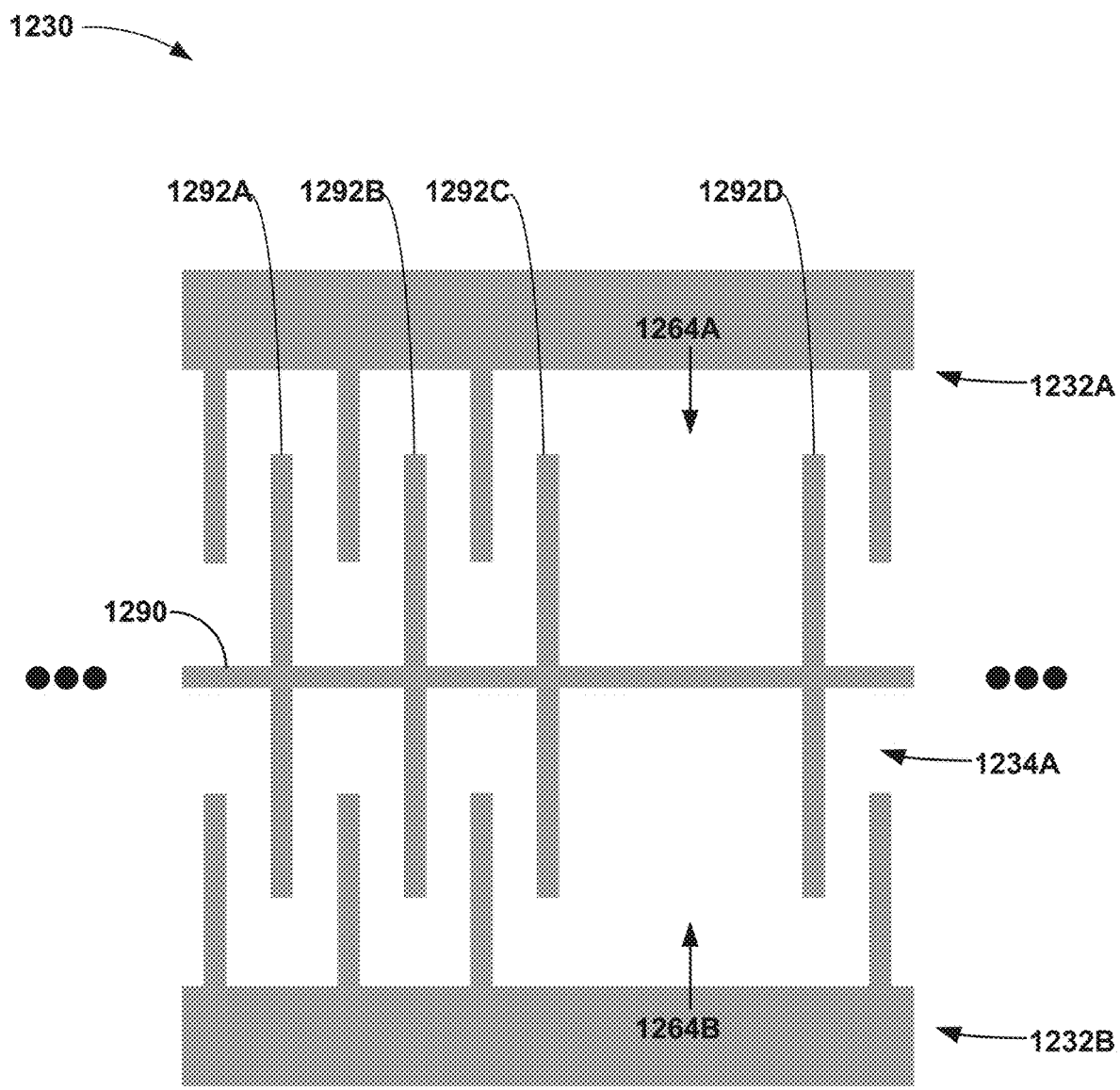
FIG. 12B is a conceptual diagram illustrating a portion of second resonator of FIG. 5A including gaps, in accordance with one or more techniques of this disclosure.

FIG. 12B is a conceptual diagram illustrating a portion of second resonator 1230 of FIG. 12A including gaps 1262A and 1262B, in accordance with one or more techniques of this disclosure. For example, third mechanical beam 1234A includes a primary member 1290 and a set of secondary members 1292A-1292D (collectively, "set of secondary members 1292"). As seen in FIG. 12B, each secondary member of the set of secondary members 1292 extends normal to primary member 1290. Third mechanical beam 1234A may include additional secondary members and additional other components that are not illustrated in FIG. 12B. Each secondary member of the set of secondary members 1292 may be substantially the same, except a distance between secondary member 1292C and 1292D is greater than a distance between any other pair of consecutive secondary members of the set of secondary members 1292.

Figure 13:
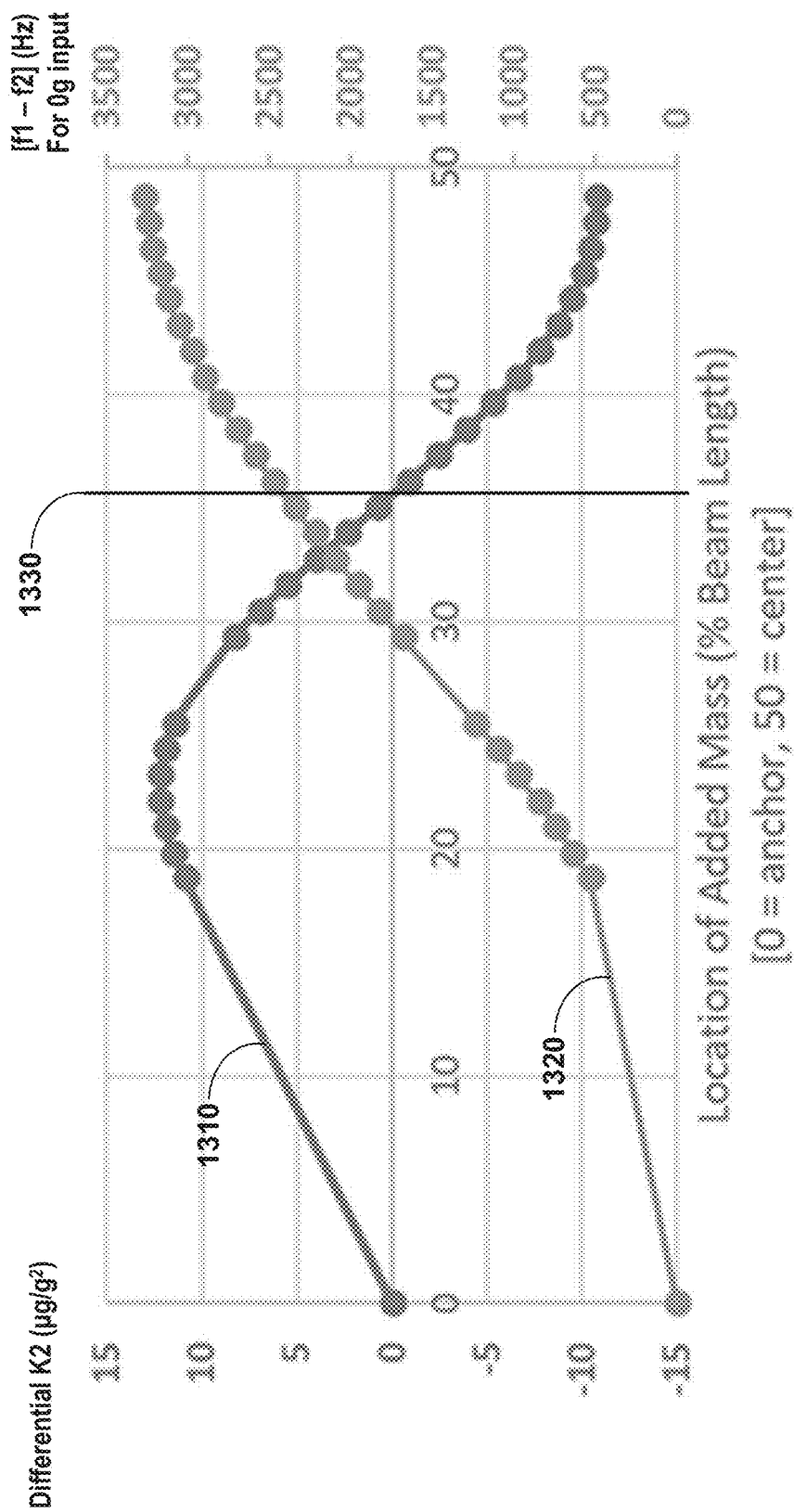
FIG. 13 is a graph illustrating a first plot representing a quadratic nonlinearity coefficient as a function of added mass position and a second plot representing a zero acceleration resonant frequency difference as a function of added mass position, in accordance with one or more techniques of this disclosure.

FIG. 13 is a graph illustrating a first plot 1310 representing a quadratic nonlinearity coefficient as a function of added mass position and a second plot 1320 representing a zero acceleration resonant frequency difference as a function of added mass position, in accordance with one or more techniques of this disclosure. For example, the "Location of Added Mass" may represent a position of added masses such as added mass 1162A and added mass 1162B on first mechanical beam 1124A, depicted in FIG. 11A, where the position is a percentage of a length of first mechanical beam 1124A extending from first end 1156 to second end 1157. As seen in first plot 610 of FIG. 6, the quadratic nonlinearity coefficient ($K_2$) is zero when the position of added mass 1162A and added mass 1162B is 35% of the length of first mechanical beam 1124A. Additionally, as seen at point 1330 of second plot 1320, a difference between the resonant frequency of first resonator 1120 and a difference between the resonant frequency of second resonator 1230 may is nonzero when the position of added mass 1162A and added mass 1162B is 35% of the length of first mechanical beam 1124A. As such, it may be beneficial for the position of added mass 1162A and added mass 1162B to be 35% of the length of first mechanical beam 1124A, since the quadratic nonlinearity coefficient is zero and the frequency difference is nonzero.

In some examples, point 1330 may represent an ideal location of added mass 1162A and added mass 1162B along first mechanical beam 1124A. In some examples, a resonant frequency of first resonator 1120 at zero acceleration may be within a range from 25 kilohertz (KHz) to 30 KHz. In some examples, a resonant frequency of second resonator 1230 at zero acceleration may be within a range from 25 kilohertz (KHz) to 30 KHz. In some examples, a difference between the resonant frequency of first resonator 1120 at zero acceleration and a resonant frequency of second resonator 1230 at zero acceleration may be within a range from 250 Hertz (Hz) to 3500 Hz when added mass 1162A and added mass 1162B is placed at 35% of a length of first mechanical beam 1124A.

Figure 14:
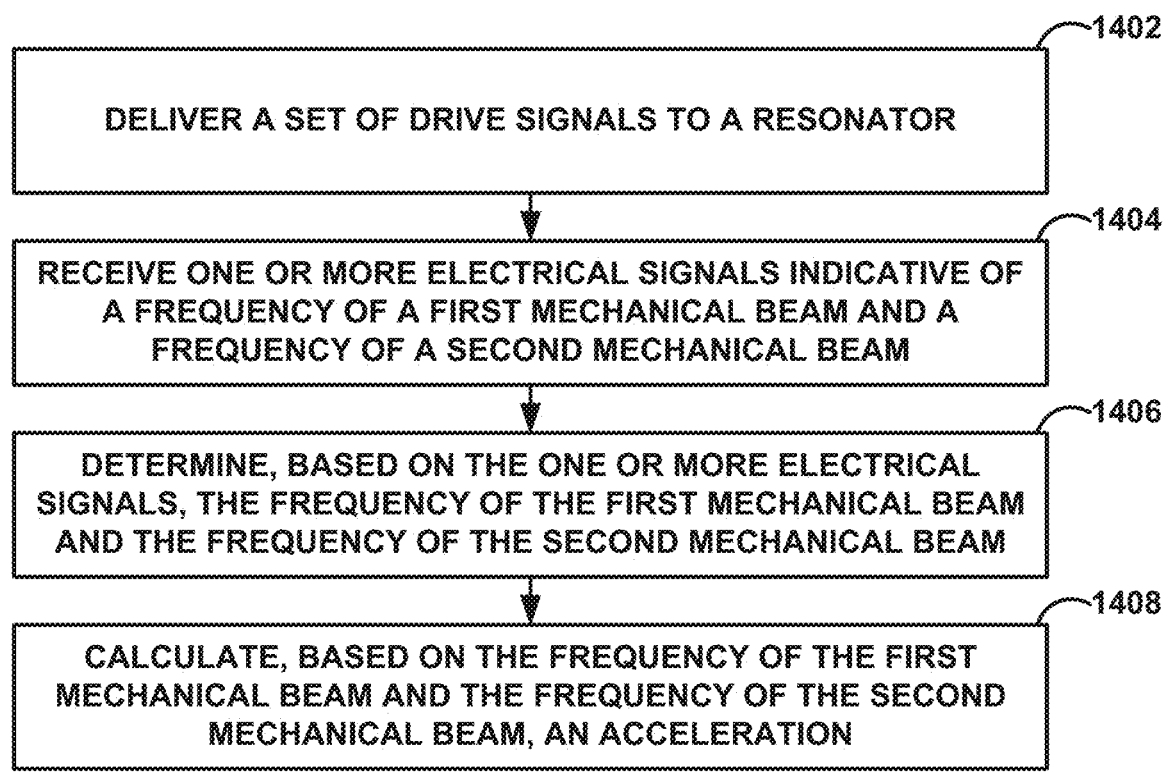
FIG. 14 is a flow diagram illustrating an example operation for determining an acceleration of a VBA, in accordance with one or more techniques of this disclosure.

FIG. 14 is a flow diagram illustrating an example operation for determining an acceleration of a VBA, in accordance with one or more techniques of this disclosure. FIG. 7 is described with respect to processing circuitry 102, resonator driver circuits 104, and proof mass assembly 111 of FIG. 3B. However, the techniques of FIG. 7 may be performed by different components of system 101, system 100 of FIG. 3A, or by additional or alternative accelerometer systems.

Resonator driver circuit 104A may deliver a set of drive signals to first resonator 120 (1402). Resonator driver circuit 104A may be electrically coupled to first resonator 120. Resonator driver circuit 104A may output the set of drive signals to first resonator 120, causing first resonator 120 to vibrate at a resonant frequency. Processing circuitry 102 may receive, via resonator driver circuit 104A, one or more electrical signals indicative of a frequency of first mechanical beam 124A and second mechanical beam 124B (1404). Subsequently, processing circuitry 102 may determine, based on the one or more electrical signals, the frequency of first mechanical beam 124A and second mechanical beam 124B (1406). The mechanical vibration frequency of first mechanical beam 124A and the mechanical vibration frequency of second mechanical beam 124B may represent a resonant frequency of first resonator 120. The resonant frequency of first resonator 120 may be correlated with an acceleration of a VBA, such as VBA 110 of FIG. 2. As such, processing circuitry 102 may calculate, based on the frequency of first mechanical beam 124A and the frequency of second mechanical beam 124B, the acceleration of VBA 110 (1408).

Although the example operation is described with respect to first resonator 120, processing circuitry 102 may additionally or alternatively determine a resonant frequency of second resonator 130. In some examples, processing circuitry 102 may be configured to determine a difference between the resonant frequency of first resonator 120 and the resonant frequency of second resonator 130 and calculate the acceleration based on a difference in the resonant frequencies.

In one or more examples, the accelerometers described herein may utilize hardware, software, firmware, or any combination thereof for achieving the functions described. Those functions implemented in software may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure.

Instructions may be executed by one or more processors within the accelerometer or communicatively coupled to the accelerometer. The one or more processors may, for example, include one or more DSPs, general purpose microprocessors, application specific integrated circuits ASICs, FPGAs, or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for performing the techniques described herein. Also, the techniques could be fully implemented in one or more circuits or logic elements.

The techniques of this disclosure may be implemented in a wide variety of devices or apparatuses that include integrated circuits (ICs) or sets of ICs (e.g., chip sets). Various components, modules, or units are described in this disclosure to emphasize functional aspects of devices configured to perform the disclosed techniques, but do not necessarily require realization by different hardware units. Rather, various units may be combined or provided by a collection of interoperative hardware units, including one or more processors as described above, in conjunction with suitable software and/or firmware.

Various examples of the disclosure have been described. These and other examples are within the scope of the following claims.

The invention claimed is:

1. A pendulous mass vibrating beam accelerometer (VBA) device, the device comprising:
   a pendulous proof mass;
   a support base defining a first plane;
   a resonator connection structure mechanically connected to the support base with an anchor, wherein the resonator connection structure is in a second plane parallel to the first plane;
   a first anchor support flexure mechanically connected to the support base and mechanically connected to a first end of the resonator connection structure;
   a second anchor support flexure mechanically connected to the support base and mechanically connected to a second end of the resonator connection structure, wherein the second end of the resonator connection structure is opposite the first end;
   a hinge flexure configured to connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base; and
   one or more resonators configured to connect the pendulous proof mass to the resonator connection structure and to flex in the second plane based on a rotation of the pendulous proof mass about the hinge flexure, wherein each of the one or more resonators vibrate at a respective driven resonant frequency within a respective frequency window, wherein the respective frequency window for each resonator of the one or more resonators encompasses expected variation of the respective driven resonator frequency in response to acceleration,
   wherein the pendulous proof mass, the hinge flexure, and the one or more resonators are in the second plane, and
   wherein the first anchor support flexure and the second anchor support flexure are configured to support the resonator connection structure such that a mechanical mode frequency window at approximately twice the respective frequency window of the one or more resonators avoids a mechanical mode frequency of the device.

2. The device of claim 1,
   wherein the second plane comprises an X-direction parallel to a long axis of the resonator connection structure and a Y-direction perpendicular to the long axis of the resonator connection structure, and
   wherein the first anchor support flexure and the second anchor support flexure define a first geometry configured to provide stiffness in the Y-direction to control a frequency of Y-direction mechanical modes.

3. The device of claim 2, further comprising a Z-direction perpendicular to both the Y-direction and the X-direction and wherein the first anchor support flexure and the second anchor support flexure define a second geometry configured to provide stiffness in the Z-direction to control a frequency of Z-direction mechanical modes.

4. The device of claim 2, wherein the X-direction stiffness is configured to prevent a coefficient of thermal expansion (CTE) mismatch between the device and the support base from affecting the respective driven resonant frequency over a temperature range.

5. The device of claim 1,
   wherein a first resonator of the one or more resonators comprises a resonator beam,
   wherein the resonator beam defines a resonator beam width within the second plane,
   wherein the resonator beam width is configured to control the respective driven resonant frequency of the first resonator.

6. The device of claim 1,
   wherein the mechanical mode frequency of the device is a first mechanical mode frequency;
   wherein a geometry of the pendulous proof mass is configured to tune the first mechanical mode frequency.

7. The device of claim 6, wherein the geometry of the pendulous proof mass comprises an outline of the pendulous proof mass.

8. The device of claim 7,
   wherein the geometry of the pendulous proof mass comprises a hole defined by edges surrounding material removed from the proof mass, and
   wherein a size and location of the hole sets the first mechanical mode frequency.

9. The device of claim 1, wherein a glass thickness of the pendulous proof mass, the one or more resonators and the resonator support structure sets the mechanical mode frequency of the device.

10. A method comprising:
    receiving, by processing circuitry, one or more electrical signals indicative of a frequency of a first resonator beam and a frequency of a second resonator beam from a vibrating beam accelerometer (VBA), wherein the VBA comprises:
    a pendulous proof mass;
    a support base defining a first plane;
    a resonator connection structure mechanically connected to the support base with an anchor, wherein the resonator connection structure is in a second plane parallel to the first plane;
    a first anchor support flexure mechanically connected to the support base and mechanically connected to a first end of the resonator connection structure;
    a second anchor support flexure mechanically connected to the support base and mechanically connected to a second end of the resonator connection structure, wherein the second end of the resonator connection structure is opposite the first end;
    a hinge flexure configured to connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the VBA parallel to the first plane of the support base; and
    one or more resonators configured to connect the pendulous proof mass to the resonator connection structure and to flex in the second plane based on a rotation of the pendulous proof mass about the hinge flexure,
    wherein each of the one or more resonators vibrate at a respective driven resonant frequency within a respective frequency window, wherein the respective frequency window for each resonator of the one or more resonators encompasses expected variation of the respective driven resonator frequency in response to acceleration, and
wherein the one or more resonators comprise the first resonator beam and the second resonator beam,
wherein the pendulous proof mass, the hinge flexure, and the one or more resonators are in the second plane, and
wherein the first anchor support flexure and the second anchor support flexure are configured to support the resonator connection structure such that a mechanical mode frequency window at approximately twice the respective frequency window of the one or more resonators avoids a mechanical mode frequency of the device,
determining, by the processing circuitry and based on the one or more electrical signals, the frequency of the first resonator beam and the frequency of the second resonator beam; and
calculating, by the processing circuitry and based on the frequency of the first resonator beam and the frequency of the second resonator beam, an acceleration of the VBA.

11. The method of claim 10, the first anchor support flexure and the second anchor support flexure are configured to prevent a coefficient of thermal expansion (CTE) mismatch between the VBA and the support base from affecting the respective driven resonant frequency over a temperature range.

12. The method of claim 10,
wherein the mechanical mode frequency of the VBA is a first mechanical mode frequency;
wherein a geometry of the pendulous proof mass is configured to set the first mechanical mode frequency.

13. A system for determining acceleration, the system comprising:
a pendulous mass vibrating beam accelerometer (VBA), comprising:
a pendulous proof mass;
a support base defining a first plane;
a resonator connection structure mechanically connected to the support base with an anchor, wherein the resonator connection structure is in a second plane parallel to the first plane;
a first anchor support flexure mechanically connected to the support base and mechanically connected to a first end of the resonator connection structure;
a second anchor support flexure mechanically connected to the support base and mechanically connected to a second end of the resonator connection structure, wherein the second end of the resonator connection structure is opposite the first end;
a hinge flexure configured to connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base; and
one or more resonators configured to connect the pendulous proof mass to the resonator connection structure and to flex in the second plane based on a rotation of the pendulous proof mass about the hinge flexure,
wherein each of the one or more resonators vibrate at a respective driven resonant frequency within a respective frequency window, wherein the respective frequency window for each resonator of the one or more resonators encompasses expected variation of the respective driven resonator frequency in response to acceleration,
wherein the pendulous proof mass, the hinge flexure, and the one or more resonators are in the second plane, and
wherein the first anchor support flexure and the second anchor support flexure are configured to support the resonator connection structure such that a mechanical mode frequency window at approximately twice the respective frequency window of the one or more resonators avoids a mechanical mode frequency of the device;
processing circuitry operatively connected to the pendulous mass VBA via a resonator driver circuit, wherein:
the resonator driver circuit is configured to output at least a first signal that causes the one or more resonators of the pendulous mass VBA to vibrate at the respective resonant frequency of each of the one or more resonators,
an acceleration of the pendulous mass VBA in a direction substantially parallel to the second plane causes a rotation of the pendulous proof mass about the hinge flexure parallel to the second plane,
the one or more resonators are configured to receive a force, in response to the rotation of the pendulous proof mass, such that the force causes a respective change in resonant frequency of the one or more resonators, and
the processing circuitry is configured to receive a second signal from the pendulous mass VBA indicative of a respective change in the resonant frequency and based on the respective change in resonant frequency, determine an acceleration measurement.

14. The system of claim 13,
wherein the second plane comprises an X-direction parallel to a long axis of the resonator connection structure and a Y-direction perpendicular to the long axis of the resonator connection structure, and
wherein the first anchor support flexure and the second anchor support flexure define a first geometry configured to provide stiffness in the Y-direction to control a frequency of Y-direction mechanical modes.

15. The system of claim 14, further comprising a Z-direction perpendicular to both the Y-direction and the X-direction and wherein the first anchor support flexure and the second anchor support flexure define a second geometry configured to provide stiffness in the Z-direction to control a frequency of Z-direction mechanical modes.

16. The system of claim 14, wherein the X-direction stiffness is configured to prevent a coefficient of thermal expansion (CTE) mismatch between the one or more resonators and the support base from affecting the respective driven resonant frequency over a temperature range.

17. The system of claim 13,
wherein a first resonator of the one or more resonators comprises a resonator beam,
wherein the resonator beam defines a resonator beam width within the second plane,
wherein the resonator beam width is configured to control the respective driven resonant frequency of the first resonator.

18. The system of claim 13,
wherein the mechanical mode frequency of the VBA is a first mechanical mode frequency;
wherein a geometry of the pendulous proof mass is configured to tune the first mechanical mode frequency.

19. The system of claim 18, wherein the geometry of the pendulous proof mass comprises an outline of a shape of the pendulous proof mass.

20. The system of claim 13, wherein a glass thickness of the pendulous proof mass, the one or more resonators and the resonator support structure sets the mechanical mode frequency of the VBA.

* * * * *